United States Patent
Hayashi et al.

(10) Patent No.: US 11,746,295 B2
(45) Date of Patent: Sep. 5, 2023

(54) POLYMERIZABLE LIQUID CRYSTAL COMPOSITION, OPTICALLY ANISOTROPIC FILM, OPTICAL FILM, POLARIZING PLATE, AND IMAGE DISPLAY DEVICE

(71) Applicant: FUJIFILM Corporation, Tokyo (JP)

(72) Inventors: Daisuke Hayashi, Kanagawa (JP); Aiko Yoshida, Kanagawa (JP); Toru Watanabe, Kanagawa (JP); Keita Takahashi, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 210 days.

(21) Appl. No.: 17/154,468

(22) Filed: Jan. 21, 2021

(65) Prior Publication Data

US 2021/0139778 A1 May 13, 2021

Related U.S. Application Data

(63) Continuation of application No. PCT/JP2019/029190, filed on Jul. 25, 2019.

(30) Foreign Application Priority Data

Jul. 25, 2018 (JP) .................. 2018-139079

(51) Int. Cl.
*C09K 19/04* (2006.01)
*C09K 19/30* (2006.01)
(Continued)

(52) U.S. Cl.
CPC .......... *C09K 19/3059* (2013.01); *C08F 20/26* (2013.01); *C09K 19/3497* (2013.01);
(Continued)

(58) Field of Classification Search
CPC ............ C09K 19/3059; C09K 19/3497; C09K 2019/0448; C09K 2019/3069;
(Continued)

(56) References Cited

U.S. PATENT DOCUMENTS

2015/0175564 A1   6/2015   Sakamoto et al.
2017/0283701 A1   10/2017  Tamura et al.
2018/0267368 A1   9/2018   Takahashi et al.

FOREIGN PATENT DOCUMENTS

CN   107001512 A   8/2017
CN   108291999 A   7/2018
(Continued)

OTHER PUBLICATIONS

Office Action, issued by the Japanese Patent Office dated Jan. 18, 2022, in connection with Japanese Patent Application No. 2020-532461.

(Continued)

*Primary Examiner* — Ruiyun Zhang
(74) *Attorney, Agent, or Firm* — Edwards Neils LLC; Jean C. Edwards, Esq

(57) ABSTRACT

An object of the present invention is to provide a polymerizable liquid crystal composition used for formation of an optically anisotropic film having excellent moisture-heat resistance and an excellent surface condition, an optically anisotropic film, an optical film, a polarizing plate, and an image display device. The polymerizable liquid crystal composition of an embodiment of the present invention is a polymerizable liquid crystal composition containing a polymerizable liquid crystal compound and a compound represented by Formula (1): $L^1\text{-}SP^1\text{-}(E^3\text{-}A^1)_m\text{-}E^1\text{-}G^1\text{-}C(=O)\text{-}O\text{-}C(=O)\text{-}G^2\text{-}E^2\text{-}(A^2\text{-}E^4)_n\text{-}SP^2\text{-}L^2$, in which a content of the compound represented by Formula (1) is 0.01 to 5 parts by mass with respect to 100 parts by mass of the polymerizable liquid crystal compound.

13 Claims, 1 Drawing Sheet

(51) Int. Cl.
| | |
|---|---|
| *C09K 19/34* | (2006.01) |
| *C08F 20/26* | (2006.01) |
| *G02F 1/1335* | (2006.01) |
| *G02F 1/13363* | (2006.01) |
| *G02F 1/1337* | (2006.01) |
| *G02B 5/30* | (2006.01) |

(52) U.S. Cl.
CPC ............ *G02B 5/30* (2013.01); *G02F 1/1335* (2013.01); *G02F 1/1337* (2013.01); *G02F 1/13363* (2013.01); *C09K 2019/0448* (2013.01); *C09K 2019/3069* (2013.01); *C09K 2019/3074* (2013.01); *C09K 2019/3075* (2013.01); *C09K 2019/3077* (2013.01); *C09K 2323/00* (2020.08); *C09K 2323/03* (2020.08); *C09K 2323/031* (2020.08); *C09K 2323/035* (2020.08)

(58) Field of Classification Search
CPC .... C09K 2019/3074; C09K 2019/3075; C09K 2323/00; C09K 2323/03; C09K 2323/031; C09K 2323/035; G02B 5/30; G02F 1/1335; G02F 1/13363; G02F 1/1337; C08F 20/26

USPC ........... 428/1.1, 1.3, 1.31, 1.33; 349/96, 117
See application file for complete search history.

(56) References Cited

FOREIGN PATENT DOCUMENTS

| | | | |
|---|---|---|---|
| JP | 2010-031223 A | | 2/2010 |
| JP | 2013-253041 A | | 12/2013 |
| JP | 2016-081035 A | | 5/2016 |
| JP | 2018-010224 A | | 1/2018 |
| WO | 2014/010325 A1 | | 1/2014 |
| WO | 2018/074311 A1 | | 4/2018 |

OTHER PUBLICATIONS

International Search Report issued in PCT/JP2019/029190 dated Oct. 15, 2019.
Written Opinion issued in PCT/JP2019/029190 dated Oct. 15, 2019.
International Preliminary Report on Patentability completed by WIPO dated Jan. 26, 2021 in connection with International Patent Application No. PCT/JP2019/029190.
Office Action, issued by the State Intellectual Property Office dated Apr. 2, 2022, in connection with Chinese Patent Application No. 201980049479.9.

POLYMERIZABLE LIQUID CRYSTAL COMPOSITION, OPTICALLY ANISOTROPIC FILM, OPTICAL FILM, POLARIZING PLATE, AND IMAGE DISPLAY DEVICE

CROSS-REFERENCE TO RELATED APPLICATIONS

This application is a Continuation of PCT International Application No. PCT/JP2019/029190 filed on Jul. 25, 2019, which was published under PCT Article 21(2) in Japanese, and which claims priority under 35 U.S.C. § 119(a) to Japanese Patent Application No. 2018-139079 filed on Jul. 25, 2018. The above applications are hereby expressly incorporated by reference, in their entirety, into the present application.

BACKGROUND OF THE INVENTION

1. Field of the Invention

The present invention relates to a polymerizable liquid crystal composition, an optically anisotropic film, an optical film, a polarizing plate, and an image display device.

2. Description of the Related Art

A polymerizable compound exhibiting reciprocal wavelength dispersibility enables, for example, accurate conversion of light ray wavelengths over a wide wavelength range and reduction in the thickness of a phase difference film due to its high refractive index, and therefore, it has been actively studied.

Furthermore, for the polymerizable compound exhibiting reciprocal wavelength dispersibility, T-type molecular design guidelines have generally been adapted, and thus, it has been required to decrease the wavelength of the major axis of the molecule and increase the wavelength of the minor axis positioned at the center of the molecule.

In this regard, it is known that a cycloalkylene skeleton having no absorption wavelength is used for connection between a skeleton of the minor axis positioned at the center of the molecule (hereinafter also referred to as a "reciprocal wavelength dispersion expressing part") and the major axis of the molecule (see, for example, JP2010-031223A, WO2014/010325A, and JP2016-081035A).

SUMMARY OF THE INVENTION

The present inventors have examined JP2010-031223A, WO2014/010325A, and JP2016-081035A and have clarified that it is possible to manufacture an optically anisotropic film having excellent moisture-heat resistance depending on the type of the polymerizable compound, but in a case of using such a polymerizable compound, a polymerizable liquid crystal composition tends to be deteriorated in solubility, and as a result, it may be difficult to manufacture an optically anisotropic film having a good surface condition.

Therefore, an object of the present invention is to provide a polymerizable liquid crystal composition used for formation of an optically anisotropic film having excellent moisture-heat resistance and an excellent surface condition, an optically anisotropic film, an optical film, a polarizing plate, and an image display device.

The present inventors have conducted intensive studies to accomplish the object, and have thus found that in a case where a polymerizable liquid crystal composition having a specific small amount of a compound having a predetermined structure is compounded together with a polymerizable liquid crystal compound, it is possible to form an optically anisotropic film having excellent moisture-heat resistance and an excellent surface condition, thereby completing the present invention.

That is, the present inventors have found that the object can be accomplished by the following configurations.

[1] A polymerizable liquid crystal composition comprising:
a polymerizable liquid crystal compound; and
a compound represented by Formula (I) which will be described later,
in which a content of the compound represented by Formula (I) which will be described later is 0.01 to 5 parts by mass with respect to 100 parts by mass of the polymerizable liquid crystal compound.

[2] The polymerizable liquid crystal composition as described in [1],
in which $G^1$ and $G^2$ in Formula (I) which will be described later are each independently a cycloalkane ring having 6 or more carbon atoms, which may have a substituent.

[3] The polymerizable liquid, crystal composition as described in [1] or [2],
in which the polymerizable liquid crystal compound is a compound represented by Formula (II) which will be described later.

[4] An optically anisotropic film obtained by polymerizing the polymerizable liquid crystal composition as described in any one of [1] to [3],

[5] An optical film comprising the optically anisotropic film as described in [4].

[6] A polarizing plate comprising:
the optical film as described in [5]; and
a polarizer.

[7] An image display device comprising the optical film as described in [5] or the polarizing plate as described in [6].

According to the present invention, it is possible to provide a polymerizable liquid crystal composition used for formation of an optically anisotropic film having excellent moisture-heat resistance and an excellent surface condition, an optically anisotropic film, an optical film, a polarizing plate, and an image display device.

DESCRIPTION OF THE PREFERRED EMBODIMENTS

Figure 1A:
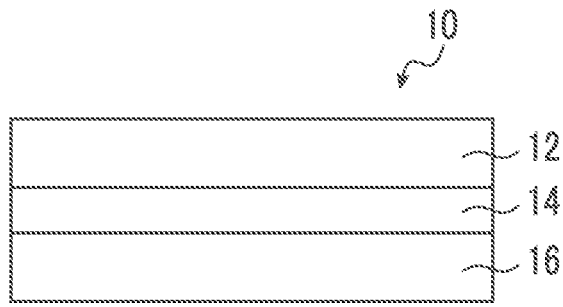
FIG. 1A is a schematic cross-sectional view showing an example of the optical film of an embodiment of the present invention.

Hereinafter, the present invention will be described in detail.

Descriptions on the constitutional requirements which will be described later are made based on representative embodiments of the present invention in some cases, but it should not be construed that the present invention is limited to such embodiments.

Furthermore, in the present specification, a numerical value range expressed using "to" means a range that includes the preceding and succeeding numerical values of "to" as the lower limit, value and the upper limit value, respectively.

In addition, in the present specification, only one kind of the substance corresponding to each component may be used alone or two or more kinds thereof may also be used in combination, for each component. Here, in a case where the two or more substances are used in combination for each, component, the content of the component refers to a total content of the substances used in combination unless otherwise specified.

In addition, in the present specification, the bonding direction of a divalent group (for example, —O—CO—) as noted is not particularly limited unless the bonding position is specified, and for example, in a case where $E^1$ in Formula (I) which will be described later is —CO—O—, $E^1$ may be either *1-CO—O-*2 or *1-O—CO-*2, in which *1 represents a bonding position to the $G^1$ side and *2 represents a bonding position to the $A^1$ side.

[Polymerizable Liquid Crystal Composition]

The polymerizable liquid crystal composition of an embodiment of the present invention contains a polymerizable liquid crystal compound and a compound represented by Formula (I) (hereinafter also abbreviated as a "compound (I)") which will be described later.

Furthermore, in the polymerizable liquid crystal composition of the embodiment of the present invention, the content of the compound (I) is 0.01 to 5 parts by mass with respect to 100 parts by mass of the polymerizable liquid crystal compound.

In the present invention, in a case where a polymerizable liquid crystal composition formed by blending the compound (I) in an amount of 0.01 to 5 parts by mass with respect to 100 parts by mass of the polymerizable liquid crystal compound is used together with the polymerizable liquid crystal compound as described above, the moisture-heat resistance and the surface condition of the optically anisotropic film are improved.

A reason therefor is not specifically clear, but is presumed to be as follows by the present inventors.

That is, it is presumed that by blending the compound (I) in a specific small amount, packing between the polymerizable liquid crystal compounds is inhibited, and as a result, the solubility of the polymerizable liquid crystal compound in an organic solvent is improved, and the surface condition cars be improved while maintaining excellent moisture-heat resistance.

Hereinafter, the respective components of the polymerizable liquid crystal composition of the embodiment of the present invention will be described in detail.

[Compound (I)]

The compound (I) contained in the polymerizable liquid crystal composition of the embodiment of the present invention is a compound represented by Formula (I).

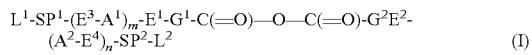

$L^1$-SP$^1$-(E$^3$-A$^1$)$_m$-E$^1$-G$^1$-C(=O)—O—C(=O)-G$^2$E$^2$-(A$^2$-E$^4$)$_n$-SP$^2$-L$^2$ (I)

In Formula (I), m and n each independently represent 0 or an integer of 1 or more.

Furthermore, in Formula (I), $E^1$, $E^2$, $E^3$, and $E^4$ each independently represent a single bond, or a divalent linking group consisting of —CO—, —O—, —S—, —C(=S), —CR$^1$R$^2$—, —CR$^3$=CR$^4$—, —NR$^5$—, or a combination of two or more thereof, where $R^1$ to $R^5$ each independently represent a hydrogen atom, a fluorine atom, or an alkyl group having 1 to 4 carbon atoms. In a case where m is an integer of 2 or more, a plurality of $E^3$'s may be the same as or different from each other, and in a case where n is an integer of 2 or more, a plurality of $E^4$'s may be the same as or different from each other.

Moreover, in Formula (I), $G^1$, $G^1$, $G^2$, $A^1$, and $A^2$ each independently represent an aromatic ring having 6 or more carbon atoms, which may have a substituent, or a cycloalkane ring having 6 or more carbon atoms, which may have a substituent. In a case where m is an integer of 2 or more, a plurality of $A^1$'s may be the same as or different from, each other, and in a case where n is an integer of 2 or more, a plurality of $A^2$'s may be the same as or different from each other.

Furthermore, in Formula (I), $SP^1$ and $SP^2$ each independently represent a single bond, a linear or branched alkylene group having 1 to 20 carbon atoms, a linear or branched alkenylene group having 2 to 20 carbon atoms, a linear or branched alkynylene group having 2 to 20 carbon atoms, or a divalent linking group in which one or more of —CH$_2$—'s constituting the alkylene group, the alkenylene group, and the alkynylene group are substituted with —O—, —S—, —NH—, —N(Q)-, or —CO—, where Q represents a substituent.

In addition, in Formula (I), $L^1$ and $L^2$ each independently represent a monovalent organic group.

In Formula (I), m and n are each independently preferably an integer of 0 to 2, and more preferably 0 or 1.

In Formula (I), examples of the divalent linking group represented by each of $E^1$, $E^2$, $E^3$, and $E^4$ include —O—, —CO—O—, —C(=S)O—, —CR$^1$R$^2$—, —CR$^1$R$^2$CR$^1$CR$^2$—, —O—CR$^1$R$^2$—, —CR$^1$R$^2$—O—CR$^1$R$^2$—, —CO—O—CR$^1$R$^2$—, —O—CO—CR$^1$R$^2$—, —CR$^1$R$^2$—O—CO—CR$^1$R$^2$—, —CR$^1$R$^2$—CO—O—CR$^1$R$^2$—, —NR$^5$—CR$^1$R$^2$—, and —CO—NR$^5$—. $R^1$, $R^2$, and $R^5$ each independently represent a hydrogen atom, a fluorine atom, or an alkyl group having 1 to 4 carbon atoms.

Among those, $E^1$ and $E^2$ are preferably —CO—O—, and $E^3$ and $E^4$ are preferably —O—, —CO—O—, or —CO—NR$^5$—, and more preferably —CO—O—.

Furthermore, in Formula (I), examples of the aromatic ring having 6 or more carbon atoms represented by each of $G^1$, $G^2$, $A^1$, and $A^2$ include an aromatic hydrocarbon ring such as a benzene ring, a naphthalene ring, an anthracene ring, and a phenanthroline ring; and an aromatic heterocyclic ring such as a furan ring, a pyrrole ring, a thiophene ring, a pyridine ring, a thiazole ring, and a benzothiazole ring. Among those, the benzene ring (for example, a 1,4-phenyl group) is preferable.

Moreover, in Formula (I), examples of the cycloalkane ring having 6 or more carbon atoms represented by each of $G^1$, $G^2$, $A^1$, and $A^2$ include a cyclohexane ring, a cycloheptane ring, a cyclooctane ring, a cyclododecane ring, and a cyclodocosane ring. Among those, the cyclohexane ring (for example, a 1,4-cyclohexylene group) is preferable, and the trans-1,4-cyclohexylene group is more preferable.

Furthermore, in Formula (I), for each of $G^1$, $G^2$, $A^1$, and $A^2$, examples of the substituent which may be contained in the aromatic ring having 6 or more carbon atoms or the cycloalkane ring having 6 or more carbon atoms include an alkyl group, an alkoxy group, and a halogen atom.

As the alkyl group, for example, a linear, branched, or cyclic alkyl group having 1 to 18 carbon atoms is preferable, an alkyl group having 1 to 8 carbon atoms (for example, a methyl group, an ethyl group, a propyl group, an isopropyl group, an n-butyl group, an isobutyl group, a sec-butyl group, a t-butyl group, and a cyclohexyl group) is more preferable, an alkyl group having 1 to 4 carbon atoms is still more preferable, and the methyl group or the ethyl group is particularly preferable.

As the alkoxy group, for example, an alkoxy group having 1 to 18 carbon atoms is preferable, an alkoxy group having 1 to 8 carbon atoms (for example, a methoxy group, an ethoxy group, an n-butoxy group, and a methoxy ethoxy group) is more preferable, an alkoxy group having 1 to 4 carbon atoms is still more preferable, and the methoxy group or the ethoxy group is particularly preferable.

Examples of the halogen atom include a fluorine atom, a chlorine atom, a bromine atom, and an iodine atom, and among these, the fluorine atom or the chlorine atom is preferable.

In the present invention, for a reason that the surface condition of air optically anisotropic film thus formed is further improved, $G^1$ and $G^2$ in Formula (I) are each independently preferably a cycloalkane ring having 6 or more carbon atoms, which may have a substituent, more preferably a cyclohexane ring (for example, a 1,4-cyclohexylene group), and still more preferably a trans-1,4-cyclohexylene group.

As the linear or branched alkylene group having 1 to 20 carbon atoms represented by each of $SP^1$ and $SP^2$ in Formula (I), a linear or branched alkylene group having 1 to 12 carbon atoms is preferable, and suitable examples thereof include a methylene group, an ethylene group, a propylene group, a butylene group, a pentylene group, a hexylene group, a methylhexylene group, and a heptylene group.

Furthermore, as the linear or branched alkenylene group having 2 to 20 carbon atoms represented by each of $SP^1$ and $SP^2$, a linear or branched alkenylene group having 2 to 20 carbon atoms is preferable, and suitable examples thereof include an ethenylene group, a propenylene group, and a butenylene group.

Moreover, suitable examples of the linear or branched alkynylene group having 2 to 20 carbon atoms represented by each of $SP^1$ and $SP^2$, include an ethynylene group.

In addition, $SP^1$ and $SP^2$ may be a divalent linking group in which one or more of —$CH_2$— constituting the alkylene group, the alkenylene group, and the alkynylene group are substituted with —O—, —S—, —NH—, —N(Q)-, or —CO—, as described above, and examples of the substituent represented by Q include the same ones as the substituents which may be contained in $G^1$ and the like in Formula (I).

In Formula (I), examples of the monovalent organic group represented by each of $L^1$ and $L^2$ include an alkyl group, an aryl group, and a heteroaryl group. The alkyl group may be linear, branched, or cyclic, but is preferably linear. The number of carbon atoms of the alkyl group is preferably 1 to 30, more preferably 1 to 20, and still more preferably 1 to 10. Further, the aryl group may be a monocycle or a polycycle, but is preferably the monocycle. The number of carbon atoms of the aryl group is preferably 6 to 25, and more preferably 6 to 10. Further, the heteroaryl group may be a monocycle or a polycycle. The number of heteroatoms constituting the heteroaryl group is preferably 1 to 3. The heteroatoms constituting the heteroaryl group is preferably a nitrogen atom, a sulfur atom, or an oxygen atom. The number of carbon atoms of the heteroaryl group is preferably 6 to 18, and more preferably 6 to 12. In addition, the alkyl group, the aryl group, and the heteroaryl group may be unsubstituted or have a substituent. Examples of the substituent include the same ones as the substituents which may be contained in $G^1$ and the like in Formula (I).

At least one of $L^1$ or $L^2$ in Formula (I) is preferably a polymerizable group.

The polymerizable group is not particularly limited, but is preferably a polymerizable group which is radically polymerizable or cationically polymerizable.

A generally known radically polymerizable group can be used as the radically polymerizable group, and suitable examples thereof include an acryloyl group and a methacryloyl group. In this case, it is known that the acryloyl group generally has a high polymerization rate, and from the viewpoint of improvement of productivity, the acryloyl group is preferable but the methacryloyl group can also be used in the same manner as the polymerizable group.

A generally known cationically polymerizable group can be used as the cationically polymerizable group, and specific examples thereof include an alicyclic ether group, a cyclic acetal group, a cyclic lactone group, a cyclic thioether group, a spiroorthoester group, and a vinyloxy group. Among those, the alicyclic ether group or the vinyloxy group is suitable, and an epoxy group, an oxetanyl group, or the vinyloxy group is particularly preferable.

Particularly preferred examples of the polymerizable group include the following groups.

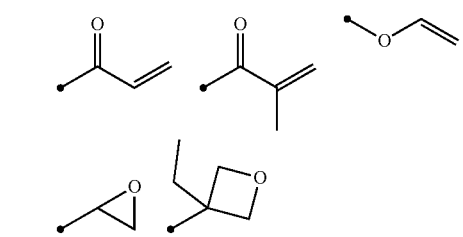

Suitable examples of such a compound (I) include a compound represented by Formula (X), and specifically the compound of Formula (X), which has a side chain structure shown in Table 1 below as K (side chain structure).

Incidentally, in Table 1 below, shown in a side chain structure of K represents a bonding position with a carbon atom (hereinafter also simply referred to as "carbonyl carbon") constituting a carbonyl group.

Furthermore, in the following description, a compound represented by Formula (X) and having a side chain structure shown in 1 in Table 1 below is cited as "Compound (X-1)", and compounds having other side chains are also cited in the same manner.

In addition, in the side chain structures shown in 1 and 7 in Table 1 below, a group adjacent to each of the acryloyloxy group and the methacryloyl group represents a propylene group (a group in which a methyl group is substituted with an ethylene group), and represents a mixture of position isomers in which the positions of the methyl groups are different.

(X)

TABLE 1
| K (Side chain structure) |
| --- |
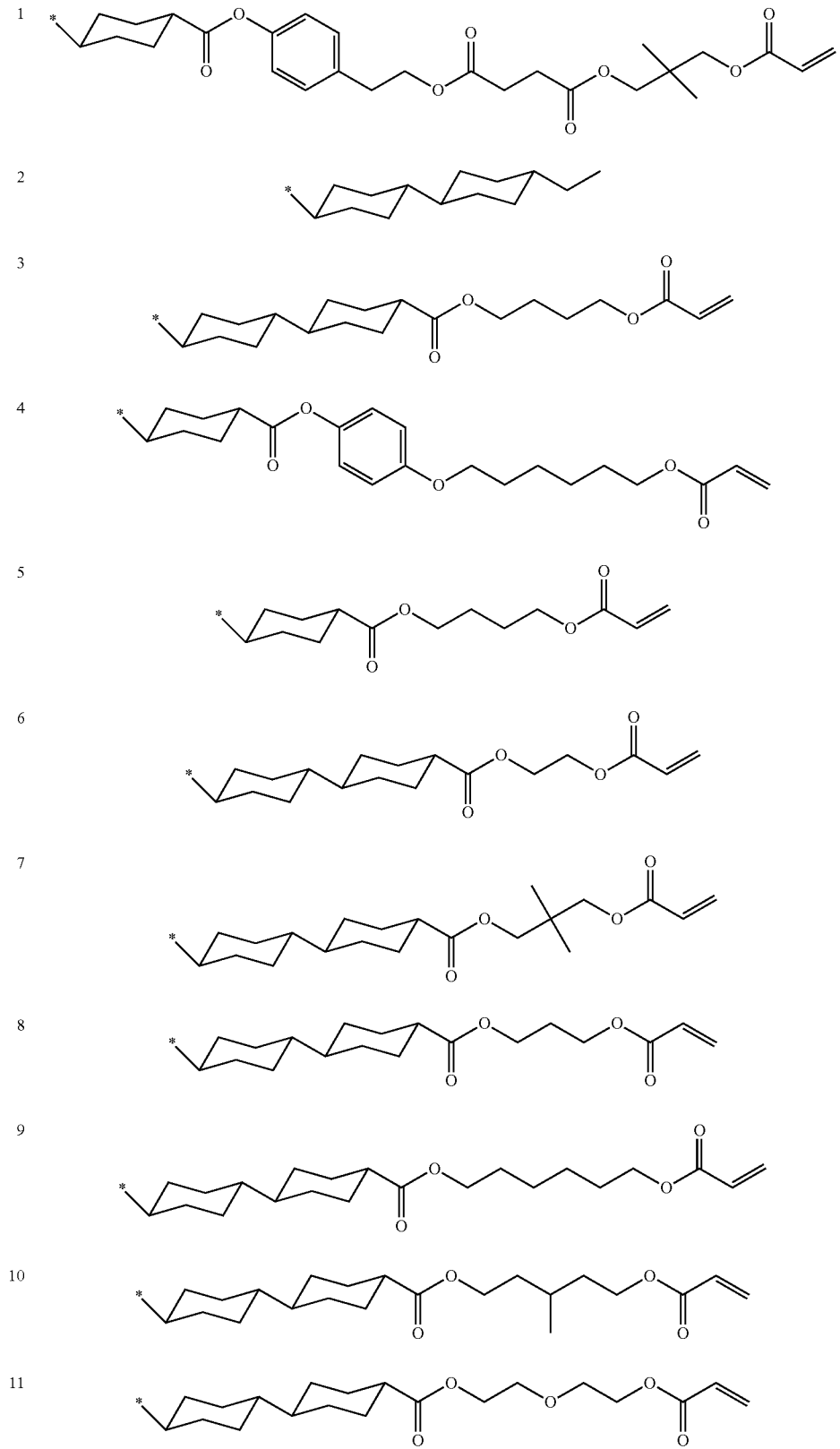

TABLE 1-continued

K (Side chain structure)

12

13

14

15

In the present invention, the content of the compound (I) is preferably 0.01 to 5 parts by mass, more preferably 0.01 to 3 parts by mass, and still more preferably 0.01 to 1 part by mass, with respect to 100 parts by mass of a polymerizable liquid crystal compound which will be described later.

[Polymerizable Liquid Crystal Compound]

The polymerizable liquid crystal compound contained in the polymerizable liquid crystal composition of the embodiment of the present invention is not particularly limited as long as it is a liquid crystal compound having a polymerizable group. Incidentally, the polymerizable group contained in the polymerizable liquid crystal compound is not particularly limited, and examples thereof include an acryloyl group, a methacryloyl group, a vinyl group, a styryl group, and an allyl group.

In the present invention, the polymerizable liquid crystal compound is preferably a polymerizable liquid crystal compound exhibiting reciprocal wavelength dispersibility.

Here, in the present specification, the "polymerizable liquid crystal compound exhibiting reciprocal wavelength dispersibility" means that in a case where an in-plane retardation (Re) value at a specific wavelength (visible light range) of a phase difference film manufactured using the polymerizable liquid crystal compound is measured, the Re value is equal or higher as a measurement wavelength is increased.

The type of the polymerizable liquid crystal compound is not particularly limited, but the polymerizable liquid crystal compounds can be classified into a rod-shaped type (rod-shaped liquid crystal compound) and a disk-shaped type (disk-shaped liquid crystal compound) based on the shape. Each of the types can further be classified into a low-molecular-weight type and a high-molecular-weight type. The term, high-molecular-weight, generally refers to having a degree of polymerization of 100 or more (Polymer Physics-Phase Transition Dynamics, by Masao Doi, page 2, published by Iwanami Shoten, Publishers, 1992).

In the present invention, any liquid crystal compounds can be used. Two or more kinds of the rod-shaped liquid crystal compounds, two or more kinds of the disk-shaped liquid crystal compounds, or a mixture of the rod-shaped liquid crystal compound and the disk-shaped liquid crystal compound may be used.

In the present invention, the polymerizable liquid crystal compound is a polymerizable liquid crystal compound represented by Formula (II) for a reason that the reciprocal wavelength dispersibility is excellent and the moisture-heat resistance of an optically anisotropic film thus formed is further improved.

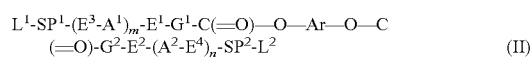

$L^1\text{-SP}^1\text{-}(E^3\text{-}A^1)_m\text{-}E^1\text{-}G^1\text{-}C(=O)\text{---}O\text{---Ar---}O\text{---}C(=O)\text{-}G^2\text{-}E^2\text{-}(A^2\text{-}E^4)_n\text{-SP}^2\text{-}L^2$ (II)

In Formula (II), any of m and n, $E^1$ to $E^4$, $G^1$ and $G^2$, $A^1$ and $A^2$, and $SP^1$ and $SP^2$ are as described in Formula (I) as described above.

Furthermore, in Formula (II), $L^1$ and $L^2$ each independently represent a monovalent organic group as in Formula (I), but in Formula (II), at least one of $L^1$ or $L^2$ represents a polymerizable group. It should be noted that in a case where Ar in Formula (II) is an aromatic ring represented by Formula (Ar-3), at least one of $L^1$ or $L^2$, or $L^3$ or $L^4$ in Formula (Ar-3) represents a polymerizable group. In addition, examples of the organic group include the same groups as those described for $L^1$ and $L^2$ in Formula (I) as described above, and examples of the polymerizable group include the same ones described as the suitable examples of $L^1$ and $L^2$ in Formula (I) as described above.

Furthermore, in Formula (II), Ar represents any aromatic ring selected from the group consisting of groups represented by Formulae (Ar-1) to (Ar-5). In addition, in Formulae (Ar-1) to (Ar-5), * represents a bonding position with an oxygen atom adjacent to the carbonyl carbon in Formula (II).

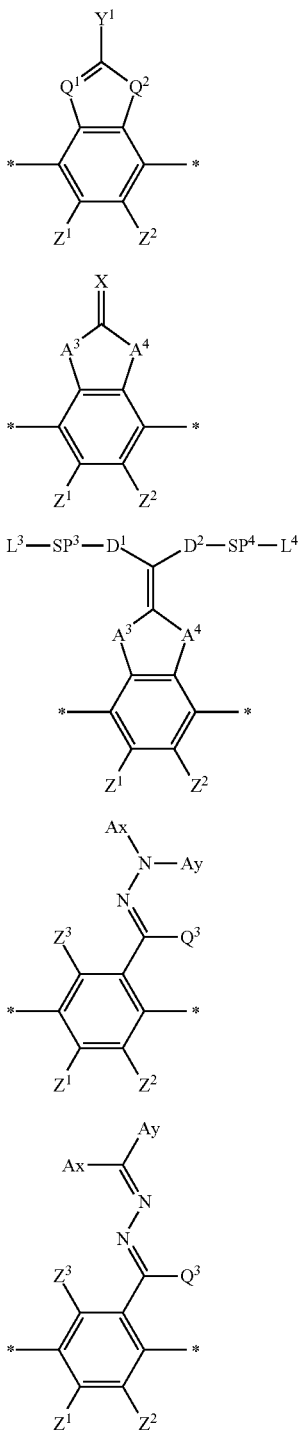

(Ar-1)

(Ar-2)

(Ar-3)

(Ar-4)

(Ar-5)

In Formula (Ar-1), $Q^1$ represents N or CH, $Q^2$ represents —S—, —O—, or —N($R^6$)—, $R^6$ represents a hydrogen atom or an alkyl group having 1 to 6 carbon atoms, and $Y^1$ represents an aromatic hydrocarbon group having 6 to 12 carbon atoms or an aromatic heterocyclic group having 3 to 12 carbon atoms, which may have a substituent.

Specific examples of the alkyl group having 1 to 6 carbon atoms represented by $R^6$ include a methyl group, an ethyl group, a propyl group, an isopropyl group, an n-butyl group, an isobutyl group, a sec-butyl group, a tert-butyl group, an n-pentyl group, and an n-hexyl group.

Examples of the aromatic hydrocarbon group having 6 to 12 carbon atoms represented by $Y^1$ include aryl groups such as a phenyl group, a 2,6-diethylphenyl group, and a naphthyl group.

Examples of the aromatic heterocyclic group having 3 to 12 carbon atoms represented by $Y^1$ include heteroaryl groups such as a thienyl group, a thiazolyl group, a furyl group, and a pyridyl group.

In addition, examples of the substituent which may be contained in $Y^1$ include the same ones as the substituents which may be contained in $G^1$ and the like in Formula (I) as described above.

In addition, in Formulae (Ar-1) to (Ar-5), $Z^1$, $Z^2$, and $Z^3$ each independently represent a hydrogen atom, a monovalent aliphatic hydrocarbon group having 1 to 20 carbon atoms, a monovalent alicyclic hydrocarbon group having 3 to 20 carbon atoms, a monovalent aromatic hydrocarbon group having 6 to 20 carbon atoms, a halogen atom, a cyano group, a nitro group, —$OR^7$, —$NR^8R^9$, or —$SR^{10}$, where $R^7$ to $R^{10}$ each independently represent a hydrogen atom or an alkyl group having 1 to 6 carbon atoms, and $Z^1$ and $Z^2$ may be bonded to each other to form an aromatic ring.

As the monovalent aliphatic hydrocarbon group having 1 to 20 carbon atoms, an alkyl group having 1 to 15 carbon atoms is preferable, an alkyl group having 1 to 8 carbon atoms is more preferable, and specifically, a methyl group, an ethyl group, an isopropyl group, a tert-pentyl group (1,1-dimethylpropyl group), a tert-butyl group, or a 1,1-dimethyl-3,3-dimethyl-butyl group is still more preferable, and the methyl group, the ethyl group, or the tert-butyl group is particularly preferable.

Examples of the monovalent alicyclic hydrocarbon group having 3 to 20 carbon atoms include monocyclic saturated hydrocarbon groups such as a cyclopropyl group, a cyclobutyl group, a cyclopentyl group, a cyclohexyl group, a cycloheptyl group, a cyclooctyl group, a cyclodecyl group, a methylcyclohexyl group, and an ethylcyclohexyl group; monocyclic unsaturated hydrocarbon groups such as a cyclobutenyl group, a cyclopentenyl group, a cyclohexenyl group, a cycloheptenyl group, a cyclooctenyl group, a cyclodecenyl group, a cyclopentadienyl group, a cyclohexadienyl group, a cyclooctadienyl group, and a cyclodecadiene; and polycyclic saturated hydrocarbon groups such as a bicyclo[2.2.1]heptyl group, a bicyclo[2.2.2]octyl group, a tricyclo[5.2.1.0$^{2,6}$]decyl group, a tricyclo[3.3.1.1$^{3,7}$]decyl group, a tetracyclo[6.2.1.1$^{3,6}$.0$^{2,7}$]dodecyl group, and an adamantyl group.

Specific examples of the monovalent aromatic hydrocarbon group having 6 to 20 carbon atoms include a phenyl group, a 2,6-diethylphenyl group, a naphthyl group, and a biphenyl group, and an aryl group having 6 to 12 carbon atoms (particularly a phenyl group) is preferable.

Examples of the halogen atom include a fluorine atom, a chlorine atom, a bromine atom, and an iodine atom, and among these, the fluorine atom, the chlorine atom, or the bromine atom is preferable.

On the other hand, specific examples of the alkyl group having 1 to 6 carbon atoms represented by each of $R^7$ to $R^{10}$ include a methyl group, an ethyl group, a propyl group, an isopropyl group, an n-butyl group, an isobutyl group, a sec-butyl group, a tert-butyl group, an n-pentyl group, and an n-hexyl group.

In addition, in Formulae (Ar-2) and (Ar-3), $A^3$ and $A^4$ each independently represent a group selected from, the group consisting of —O—, —N(R$^{11}$)—, —S—, and —CO, and R$^{11}$ represents a hydrogen atom or a substituent.

Examples of the substituent represented by R$^{11}$ include the same ones as the substituents which may be contained in G$^1$ and the like in Formula (I) as described above.

Furthermore, in Formula (Ar-2), X represents a hydrogen atom or a non-metal atom of Groups XIV to XVI, to which a substituent may be bonded.

Moreover, examples of the non-metal atom of Groups XIV to XVI represented by X include an oxygen atom, a sulfur atom, a nitrogen atom having a substituent, and a carbon atom having a substituent, and specific examples of the substituent include an alkyl group, an alkoxy group, an alkyl-substituted alkoxy group, a cyclic alkyl group, an aryl group (for example, a phenyl group and a naphthyl group), a cyano group, an amino group, a nitro group, an alkylcarbonyl group, a sulfo group, and a hydroxyl group.

In addition, in Formula (Ar-3), D$^1$ and D$^2$ each independently represent a single bond, or a divalent linking group consisting of —CO—, —O—, —S—, —C(=S)—, —CR$^1$R$^2$—, —CR$^3$=CR$^4$—, —NR$^5$—, or a combination of two or more thereof, where R$^1$ to R$^5$ each independently represent a hydrogen atom, a fluorine atom, or an alkyl group having 1 to 4 carbon atoms.

Here, examples of the divalent linking group include the same groups as those described tor E$^1$ to E$^4$ in Formula (I) as described above.

Moreover, in Formula (Ar-3), SP$^3$ and SP$^4$ each independently represent a single bond, a linear or branched alkylene group having 1 to 20 carbon atoms, a linear or branched alkenylene group having 2 to 20 carbon atoms, a linear or branched alkynylene group having 2 to 20 carbon atoms, or a divalent linking group in which one or more of —CH$_2$—'s constituting the alkylene group, the alkenylene group, and the alkynylene group are substituted with —O—, —S—, —NH—, —N(Q)-, or —CO—, where Q represents a substituent.

Here, examples of the alkylene group, the alkenylene group, and the alkynylene group include the same ones as those described for SP$^1$ and SP$^2$ in Formula (I) as described above.

In addition, examples of the substituent include the same ones as the substituents which may be contained in G$^1$ and the like in Formula (I) as described above.

Furthermore, in Formula (Ar-3), L$^3$ and L$^4$ each independently represent a monovalent organic group, and at least one of L$^3$ or L$^4$, or L$^1$ or L$^2$ in Formula (II) represents a polymerizable group.

Examples of the monovalent organic group include the same ones as the monovalent organic groups described for L$^1$ and L$^2$ in Formula (I) as described above.

In addition, examples of the polymerizable group include the same ones as the polymerizable groups described as the suitable examples of L$^1$ and L$^2$ in Formula (I) as described above.

Moreover, in Formulae (Ar-4) and (Ar-5), Ax represents an organic group having 2 to 30 carbon atoms, which has at least one aromatic ring selected from the group consisting of an aromatic hydrocarbon ring and an aromatic heterocyclic ring.

Furthermore, in Formulae (Ar-4) and (Ar-5), Ay represents a hydrogen atom, an alkyl group having 1 to 12 carbon atoms, which may have a substituent, or an organic group having 2 to 30 carbon atoms, which has at least one aromatic ring selected from the group consisting of an aromatic hydrocarbon ring and an aromatic heterocyclic ring.

Here, the aromatic ring in each of Ax and Ay may have a substituent, and Ax and Ay may be bonded to each other to form a ring.

In addition, Q$^3$ represents a hydrogen atom or an alkyl group having 1 to 6 carbon atoms, which may have a substituent.

Examples of each of Ax and Ay include the ones described in paragraphs [0039] to [0095] of WO2014/010325A.

Incidentally, specific examples of the alkyl group having 1 to 6 carbon atoms represented by Q$^3$ include a methyl group, an ethyl group, a propyl group, an isopropyl group, an n-butyl group, an isobutyl group, a sec-butyl group, a tert-butyl group, an n-pentyl group, and an n-hexyl group, and examples of the substituent include the same ones as the substituents which may be contained in G$^1$ and the like in Formula (I) as described above.

Examples of such a polymerizable liquid crystal compound include the compound represented by General Formula (I) described in JP2008-297210A (in particular, the compounds described in paragraph Nos. [0034] to [0039]), the compounds represented by General Formula (1) described in JP2010-084032A (in particular, the compounds described in paragraph Nos. [0067] to [0073]), the compound represented by General Formula (II) described in JP2016-053709A (in particular, the compounds described in paragraph Nos. [0036] to [0043]), and the compounds represented by General Formula (1) described in JP2016-081035A (in particular, the compounds described in paragraph Nos. [0043] to [0055]).

Specific examples of the polymerizable liquid crystal compound include compounds represented by Formulae (1) and (12), and more specific examples thereof include compounds having side chain structures shown in Table 2 below as K (side chain structure) in Formulae (1) to and (12).

Furthermore, in Table 2 below, shown in the side chain structure of K represents a bonding position to an aromatic ring.

In addition, in the side chain structures shown in 1 and 7 in Table 2 below, a group adjacent to each of the aery toy foxy group and the methacryloyl group represents a propylene group (a group in which a methyl group is substituted with an ethylene group), and represents a mixture of position isomers in which the positions of the methyl groups are different.

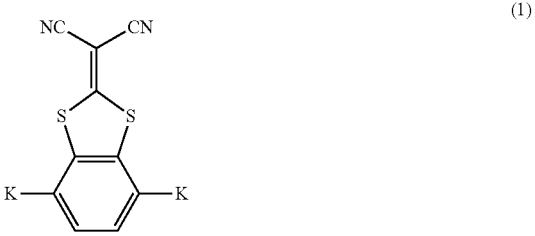

(1)

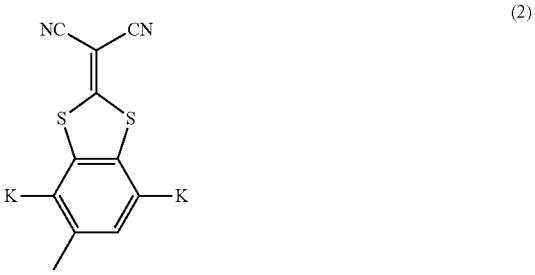

(2)

(3)
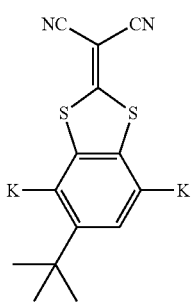
(4)
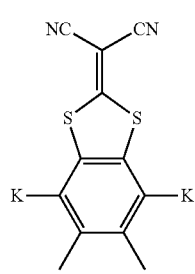
(5)
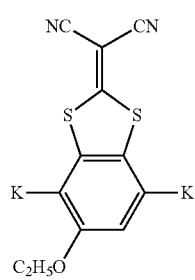
(6)
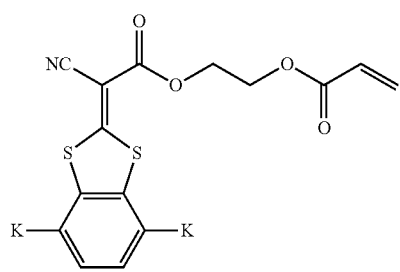
(7)
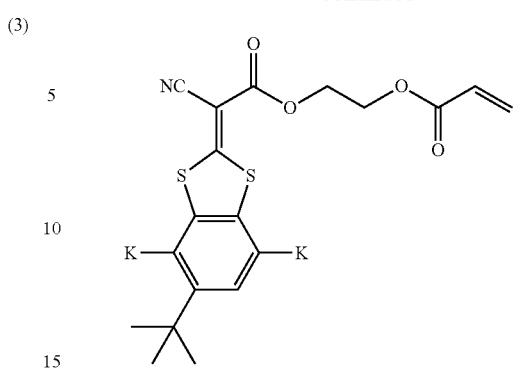
(8)
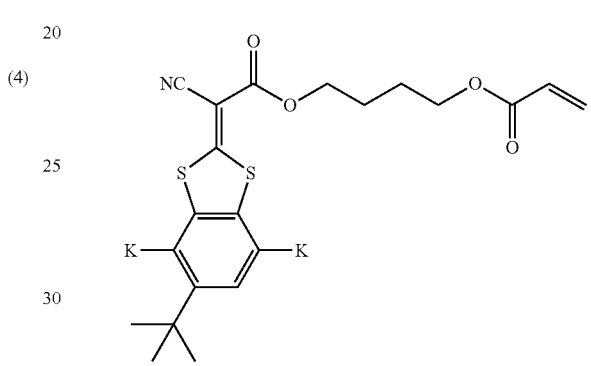
(9)
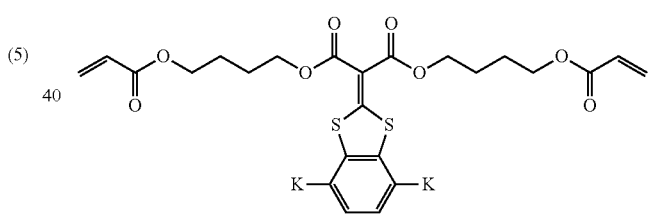
(10)
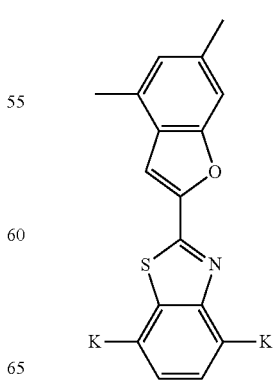

17
-continued
(11)
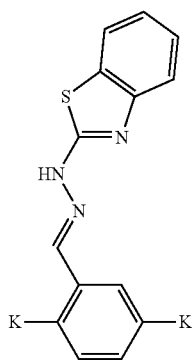
18
-continued
(12)
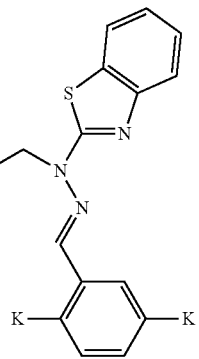
TABLE 2
K (Side chain structure)
1. 
2. 
3. 
4. 
5. 
6. 
7.

TABLE 2-continued

K (Side chain structure)

| 8 | (structure: *—O—C(=O)—cyclohexyl—cyclohexyl—C(=O)—O—CH2CH2CH2—O—C(=O)—CH=CH2) |
| 9 | (structure: *—O—C(=O)—cyclohexyl—cyclohexyl—C(=O)—O—(CH2)5—O—C(=O)—CH=CH2) |
| 10 | (structure: *—O—C(=O)—cyclohexyl—cyclohexyl—C(=O)—O—CH2CH(CH3)CH2CH2—O—C(=O)—CH=CH2) |
| 11 | (structure: *—O—C(=O)—cyclohexyl—cyclohexyl—C(=O)—O—CH2CH2—O—CH2CH2—O—C(=O)—CH=CH2) |
| 12 | (structure: *—O—C(=O)—cyclohexyl—cyclohexyl—C(=O)—O—CH2CH(OC(=O)CH=CH2)CH2—O—C(=O)—CH=CH2) |
| 13 | (structure: *—O—C(=O)—cyclohexyl—cyclohexyl—O—(CH2)4—O—C(=O)—CH=CH2) |
| 14 | (structure: *—O—C(=O)—cyclohexyl—cyclohexyl—O—(CH2)6—O—C(=O)—CH=CH2) |
| 15 | (structure: *—O—C(=O)—phenyl—O—(CH2)4—O—C(=O)—CH=CH2) |

[Polymerization Initiator]

The polymerizable liquid crystal composition of the embodiment of the present invention preferably contains a polymerization initiator.

The polymerization initiator to be used is preferably a photopolymerization initiator capable of initiating a polymerization reaction upon irradiation with ultraviolet rays.

Examples of the photopolymerization initiator include α-carbonyl compounds (described in each of the specifications of U.S. Pat. Nos. 2,367,661A and 2,367,670A), acyloin ethers (described in the specification of U.S. Pat. No. 2,448,828A), α-hydrocarbon-substituted aromatic acyloin compounds (described in the specification of U.S. Pat. No. 2,722,512A), multinuclear quinone compounds (described in each of the specifications of U.S. Pat. Nos. 3,046,127A and 2,951,758A), combinations of a triarylimidazole dimer and a p-aminophenyl ketone (described in the specification of U.S. Pat. No. 3,549,367A), acridine and phenazine compounds (described in JP1985-105667A (JP-S60-105667A) and the specification of U.S. Pat. No. 4,239,850A), oxadiazole compounds (described in the specification of U.S. Pat. No. 4,212,970A), and acyl phosphine oxide compounds (described in JP1988-040799B (JP-S63-040799B), JP1993-029234B (JP-H05-029234B), JP1998-095788A (JP-H10-095788A), and JP1998-029997A (JP-H10-029997A)).

In addition, in the present invention, it is also preferable that the polymerization initiator is an oxime-type polymerization initiator, and specific examples of the polymerization initiator include the initiators described in paragraphs [0049] to [0052] of WO2017/170443A.

[Solvent]

It is preferable that the polymerizable liquid crystal composition of the embodiment of the present invention contains a solvent from the viewpoint of workability for forming an optically anisotropic film, and the like.

Specific examples of the solvent include ketones (for example, acetone, 2-butanone, methyl isobutyl ketone, cyclohexanone, and cyclopentanone), ethers (for example, dioxane and tetrahydrofuran), aliphatic hydrocarbons (for example, hexane), alicyclic hydrocarbons (for example, cyclohexane), aromatic hydrocarbons (for example, toluene, xylene, and trim ethylbenzene), halogenated carbons (for example, dichloromethane, dichloroethane, dichlorobenzene, and chlorotoluene), esters (for example, methyl acetate, ethyl acetate, and butyl acetate), water, alcohols (for example, ethanol, isopropanol, butanol, and cyclohexanol), cellosolves (for example, methyl cellosolve and ethyl cellosolve), cellosolve acetates, sulfoxides (for example, dimethyl sulfoxide), and amides (for example, dimethylformamide and dimethylacetamide), and these may be used singly or in combination of two or more kinds thereof.

[Leveling Agent]

It is preferable that the polymerizable liquid crystal composition of the embodiment of the present invention contains a leveling agent from the viewpoint that the surface of an optically anisotropic film is maintained smooth and the alignment is easily controlled.

Such a leveling agent is preferably a fluorine-based leveling agent or a silicon-based leveling agent for a reason that it has a high leveling effect on the addition amount, and the leveling agent is more preferably a fluorine-based leveling agent from the viewpoint, that it is less likely to cause bleeding (bloom or bleed).

Specific examples of the leveling agent include the compounds described in paragraphs [0079] to [0102] of JP2007-069471A, the compound represented by General Formula (I) described in JP2013-047204A (in particular, the compounds described in paragraphs [0020] to [0032]), the compound represented by General Formula (1) described in JP2012-211306A (in particular, the compounds described in paragraphs [0022] to [0029]), the liquid crystal alignment accelerator represented by General Formula (I) described in JP2002-129162A (in particular, the compounds described in paragraphs [0076] to [0078] and [0082] to [0084]), and the compounds represented by General Formulae (I), (II), and (HI) described in JP2005-099248A (in particular, the compounds described in paragraphs [0092] to [0096]). In addition, the leveling agent may also function as an alignment control agent which will be described later.

[Alignment Control Agent]

The polymerizable liquid crystal composition of the embodiment of the present invention can contain an alignment control agent, as desired.

With the alignment control agent, various alignment states such as homeotropic alignment (vertical alignment), tilt alignment, hybrid alignment, and cholesteric alignment can be formed, in addition to the homogeneous alignment, and specific alignment states can be controlled and achieved more uniformly and more accurately.

As an alignment control agent which accelerates the homogeneous alignment, for example, a low-molecular-weight alignment control agent or a high-molecular-weight alignment control agent can be used.

With regard to the low-molecular-weight alignment control agent, reference can be made to the description in, for example, paragraphs [0009] to [0083] of JP2002-020363A, paragraphs [0111] to [0120] of JP2006-106662A, and paragraphs [0021] to [0029] of JP2012-211306A, the contents of which are hereby incorporated by reference.

In addition, with regard to the high-molecular-weight alignment control agent, reference can be made to the description in, tor example, paragraphs [0021] to [0057] of JP2004-198511A and paragraphs [0121] to [0167] of JP2006-106662A, the contents of which are hereby incorporated by reference.

Furthermore, examples of the alignment control agent that forms or accelerates the homeotropic alignment include a boronic acid compound and an on him salt compound, and specifically, reference can be made to the compounds described in paragraphs [0023] to [0032] of JP2008-225281A, paragraphs [0052] to [0058] of JP2012-208397A, paragraphs [0024] to [0055] of JP2008-026730A, paragraphs [0043] to [0055] of JP2016-193869A, and the like, the contents of which are hereby incorporated by reference.

On the other hand, the cholesteric alignment can be achieved by adding a chiral agent to the polymerizable liquid crystal composition of the embodiment of the present invention, and it is possible to control the direction of revolution of the cholesteric alignment by its chiral direction. Incidentally, it is possible to control the pitch of the cholesteric alignment in accordance with the alignment regulating force of the chiral agent.

In a case where an alignment control agent is contained, a content thereof is preferably 0.01% to 10% by mass, and more preferably 0.05% to 5% by mass, with respect to the mass of the total solid content of the polymerizable liquid crystal composition. In a case where the content is within the range, it is possible to obtain an optically anisotropic film which has no precipitation or phase separation, alignment defects, or the like, and is uniform and highly transparent while achieving a desired alignment state.

These alignment control agents can further impart a polymerizable functional group, in particular, a polymerizable functional group which is polymerizable with a polymerizable liquid crystal compound constituting the polymerizable liquid crystal composition of the embodiment of the present invention.

[Other Components]

The polymerizable liquid crystal composition of the embodiment of the present invention may contain components other than the above-mentioned components, and examples of such other components include a liquid crystal compound other than the above-mentioned polymerizable liquid crystal compound, a surfactant, a tilt angle control agent, an alignment aid, a plasticizer, and a crosslinking agent.

[Optically Anisotropic Film]

An optically anisotropic film of an embodiment of the present invention is an optically anisotropic film obtained by polymerizing the above-mentioned polymerizable liquid crystal composition of the embodiment of the present invention.

Examples of a method for forming the optically anisotropic film include a method in which the above-mentioned polymerizable liquid crystal composition of the embodiment of the present invention is used to cause a desired alignment state, which is then fixed by polymerization.

Here, the polymerization conditions are not particularly limited, but in the polymerization by irradiation with light, ultraviolet rays are preferably used. The irradiation dose is preferably 10 mJ/cm$^2$ to 50 J/cm$^2$, more preferably 20 mJ/cm$^2$ to 5 J/cm$^2$, still more preferably 30 mJ/cm$^2$ to 3 J/cm$^2$, and particularly preferably 50 mJ/cm$^2$ to 1,000 mJ/cm$^2$, In addition, the polymerization may be carried out under a heating condition in order to accelerate the polymerization reaction.

In addition, in the present invention, the optically anisotropic film can be formed on any of supports in the optical film of the embodiment of the present invention which will be described later or a polarizer in the polarizing plate of an embodiment of the present invention which will be described later.

The optically anisotropic film of the embodiment of the present invention preferably satisfies Formula (III).

$$0.50 < Re(450)/Re(550) < 1.00 \qquad \text{(III)}$$

Here, in Formula (III), Re(450) represents an in-plane retardation of the optically anisotropic film at a wavelength of 450 nm, and Re(550) represents an in-plane retardation of the optically anisotropic film at a wavelength of 550 nm. In addition, in the present specification, in a case where the measurement wavelength of the retardation is not specified, the measurement wavelength is 550 nm.

Furthermore, the values of the in-plane retardation and the thickness-direction retardation refer to values measured with light at the measurement wavelength using AxoScan OPMF-1 (manufactured by Opto Science, Inc.).

Specifically, by inputting the average refractive index ((Nx+Ny+Nz)/3) and the film thickness (d (μm)) to AxoScan OPMF-1, it is possible to calculate:

Slow axis direction (°)

$$Re(\lambda)=R0(\lambda)$$

$$Rth(\lambda)=((nx+ny)/2-nz)\times d.$$

In addition, R0(λ) is expressed in a numerical value calculated with AxoScan OPMF-1, but means Re(λ).

The optically anisotropic film of the embodiment of the present invention is preferably a positive A-plate or a positive C-plate, and more preferably the positive A-plate.

Here, the positive A-plate (A-plate which is positive) and the positive C-plate (C-plate which is positive) are defined as follows.

In a case where a refractive index in a film in-plane slow axis direction (in a direction in which an in-plane refractive index is maximum) is defined as nx, a refractive index in an in-plane direction orthogonal to the in-plane slow axis is defined as ny, and a refractive index in a thickness direction is defined as nz, the positive A-plate satisfies the relationship of Formula (A1) and the positive C-plate satisfies the relationship of Formula (C1). In addition, the positive A-plate has an Rth showing a positive value and the positive C-plate has an Rth showing a negative value.

$$nx>ny\approx nz \quad \text{Formula (A1)}$$

$$nz>nx\approx ny \quad \text{Formula (C1)}$$

Furthermore, the symbol, "≈", encompasses not only a case where the both sides are completely the same as each other but also a case where the both are substantially the same as each other.

The expression, "substantially the same", means that with regard to the positive A-plate, for example, a case where (ny−nz)×d (in which d is the thickness of a film) is −10 to 10 nm, and preferably −5 to 5 nm is also included in "ny≈nz", and a case where (nx−nz)×d is −10 to 10 nm, and preferably −5 to 5 nm is also included in "nx≈nz". In addition, with regard to the positive C-plate, for example, a case where (nx−ny)×d (in which d is the thickness of a film) is 0 to 10 nm, and preferably 0 to 5 nm is also included in "nx≈ny".

In a case where the optically anisotropic film of the embodiment of the present, invention is a positive A-plate, the Re(550) is preferably 100 to 180 nm, more preferably 120 to 160 nm, still more preferably 130 to 150 nm, and particularly preferably 130 to 140 nm, from the viewpoint that the optically anisotropic film functions as a λ/4 plate.

Here, the "λ/4 plate" is a plate having a λ/4 function, specifically, a plate having a function of converting a linearly polarized light at a certain specific wavelength into a circularly polarized light (or converting a circularly polarized light to a linearly polarized Sight).

[Optical Film]

The optical film of the embodiment of the present invention is an optical film having the optically anisotropic film of the embodiment of the present invention.

Figure 1B:
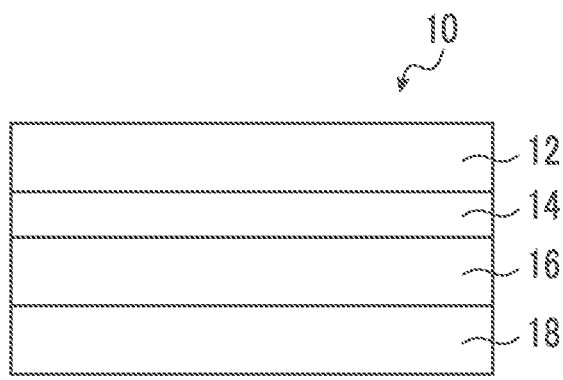
FIG. 1B is a schematic cross-sectional view showing an example of the optical film of the embodiment of the present invention.
Figure 1C:
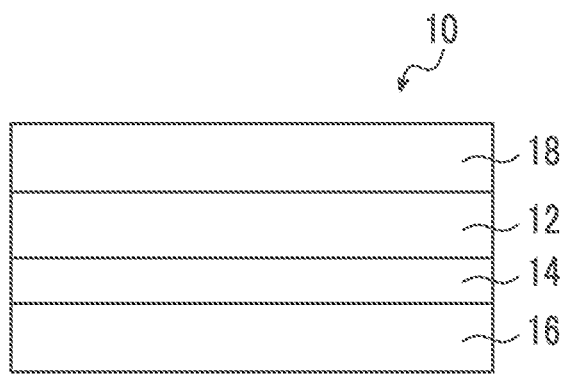
FIG. 1C is a schematic cross-sectional view showing an example of the optical film of the embodiment of the present invention.

FIG. 1A, FIG. 1B, and FIG. 1C (these drawings are hereinafter simply referred to as "FIG. 1" unless it is necessary that they are particularly distinguished from each other) are each a schematic cross-sectional view showing an example of the optical film of the embodiment of the present invention.

Furthermore, FIG. 1 is a schematic view, and the thicknesses relationship, the positional relationship, and the like among the respective layers are not necessarily consistent with actual ones, and any of the support, the alignment film, and the hard coat layer shown in FIG. 1 are optional constitutional members.

An optical film 10 shown in FIG. 1 has a support 16, an alignment film 14, and an optically anisotropic film 12 in this order.

In addition, the optical film 10 may have a hard coat layer 18 on the side of the support 16 opposite to the side on which the alignment film 14 is provided as shown in FIG. 1B, and may have the hard coat layer 18 on the side of the optically anisotropic film 12 opposite to the side on which the alignment film 14 is provided as shown in FIG. 1C.

Hereinafter, various members used for the optical film of the embodiment of the present invention will be described in detail.

[Optically Anisotropic Film]

The optically anisotropic film which the optical film of the embodiment of the present invention has is the above-mentioned optically anisotropic film of the embodiment of the present invention.

In the optical film of the embodiment of the present invention, the thickness of the optically anisotropic film is not particularly limited, but is preferably 0.1 to 10 μm, and more preferably 0.5 to 5 μm.

[Support]

The optical film of the embodiment of the present invention may have a support as a base material for forming an optically anisotropic film as described above.

Such a support is preferably transparent, and specifically, it preferably has a light transmittance of 80% or more.

Examples of such a support include a glass substrate and a polymer film, and examples of the material for the polymer film include cellulose-based polymers; acrylic polymers having an acrylic ester polymer such as polymethyl methacrylate and a lactone ring containing polymer; thermoplastic norbornene-based polymers; polycarbonate-based polymers; polyester-based polymers such as polyethylene terephthalate and polyethylene naphthalate; styrene-based polymers such as polystyrene and an acrylonitrile-styrene copolymer (AS resin); polyolefin-based polymers such as polyethylene, polypropylene, and an ethylene-propylene copolymer; vinyl chloride-based polymers; amide-based polymers such as nylon and aromatic polyamide; imidebased polymers; sulfone-based polymers; polyether sulfone-based polymers; polyether ether ketone-based polymers; polyphenylene sulfide-based polymers; vinylidene chloride-based polymers; vinyl alcohol-based polymers; vinyl butyral-based polymers; arylate-based polymers; polyoxymethylene-based polymers; epoxy-based polymers; and polymers obtained by mixing these polymers.

In addition, an aspect in which a polarizer which will be described later may also function as such a support is also available.

In the present invention, the thickness of the support is not particularly limited, but is preferably 5 to 60 µm, and more preferably 5 to 30 µm.

[Alignment Film]

In a case where the optical film of the embodiment of the present invention has any of the above-mentioned supports, it is preferable that the optical film has an alignment film between the support and the optically anisotropic film. Further, an aspect in which the above-mentioned support may also function as an alignment film is also available.

The alignment film generally has a polymer as a main component. The materials for the polymer material for an alignment film, are described in many documents, and many commercially available products can be used.

The polymer material used in the present invention is preferably a polyvinyl alcohol or a polyimide, or a derivative thereof. Particularly, a modified or non-modified polyvinyl alcohol is preferable.

Examples of the alignment film that can be used in the present invention include the alignment films described for Line 24 on Page 43 to Line 8 on Page 49 of WO01/088574A; the modified polyvinyl alcohols described in paragraphs [0071] to [0095] of JP3907735B; and the liquid crystal alignment film formed by a liquid crystal alignment agent, described in JP2012-155308A.

In the present invention, for a reason that it is possible to prevent deterioration in the surface condition by avoiding a contact with the surface of an alignment film upon formation of the alignment film, a photo-alignment film is also preferably used as the alignment film.

The photo-alignment film is not particularly limited, but the polymer materials such as a polyamide compound and a polyimide compound, described in paragraphs 0024 to 0043 of WO2005/096041A; the liquid crystal alignment film formed by a liquid crystal alignment agent having a photo-alignment group, described in JP2012-155308A; LPP-JP265CP, trade name, manufactured by Rolic Technologies Ltd.; or the like can be used.

In addition, in the present invention, the thickness of the alignment film is not particularly limited, but from the viewpoint of forming an optically anisotropic film having a homogeneous film thickness by alleviating the surface roughness that can be present on the support, the thickness is preferably 0.01 to 10 µm, more preferably 0.01 to 1 µm, and still more preferably 0.01 to 0.5 µm.

[Hard Coat Layer]

It is preferable that the optical film of the embodiment of the present invention has a hard coat Saver in order to impart physical strength to the film. Specifically, the optical film may have the hard coat layer on the side of the support opposite to the side on which the alignment film is provided (see FIG. 1B) or the optical film may have the hard coat layer on the side of the optically anisotropic film opposite to the side on which the alignment film is provided (see FIG. 1C).

As the hard coat layer, those described in paragraphs [0190] to [0196] of JP2009-098658A can be used.

[Other Optically Anisotropic Films]

The optical film of the embodiment of the present invention may have other optically anisotropic films, in addition to the optically anisotropic film of the embodiment of the present invention.

That is, the optical film of the embodiment of the present invention may have a laminated structure having the optically anisotropic film of the embodiment of the present invention, and other optically anisotropic films.

Examples of such other optically anisotropic films include an optically anisotropic film obtained using the polymerizable liquid crystal compound described above while not blending the above-mentioned compound (I).

[Ultraviolet Absorber]

The optical film of the embodiment of the present invention preferably includes an ultraviolet (UV) absorber, taking an effect of external light (particularly ultraviolet rays) into consideration.

The ultraviolet absorber may be contained in the optically anisotropic film of the embodiment of the present invention or may also be contained in a member other than an optically anisotropic film constituting the optical film of the embodiment of the present invention. Suitable examples of the member other than the optically anisotropic film include a support.

As the ultraviolet absorber, any one of ultraviolet absorbers known in the related art, which can express ultraviolet absorptivity, can be used. Among such the ultraviolet absorbers, a benzotriazole-based or hydroxyphenyltriazine-based ultraviolet absorber is preferably used from the viewpoint that it has high ultraviolet absorptivity and ultraviolet absorbing ability (ultraviolet-shielding ability) used for an image display device is obtained.

In addition, in order to broaden ultraviolet absorbing ranges, two or more of ultraviolet absorbers having different maximum absorption wavelengths can be used in combination.

Specific examples of the ultraviolet absorber include the compounds described in paragraphs [0258] and [0259] of JP2012-018395A and the compounds described in paragraphs [0055] to [0105] of JP2007-072163A.

In addition, as a commercially available product thereof, for example, Tinuvin 400, Tinuvin 405, Tinuvin 460, Tinuvin 477, Tinuvin 479, and Tinuvin 1577 (all manufactured by BASF), or the like can be used.

[Polarizing Plate]

A polarizing plate of an embodiment of the present invention has the above-mentioned optical film of the embodiment of the present invention and a polarizer.

Furthermore, in a ease where the above-mentioned optically anisotropic film of the embodiment of the present invention is a λ/4 plate (positive A-plate), the polarizing plate of the embodiment of the present invention can be used as a circularly polarizing plate.

In addition, in a case where the above-mentioned optically anisotropic film of the embodiment of the present invention is a λ/4 plate (positive A-plate), an angle between the slow axis of the λ/4 plate and the absorption axis of a polarizer which will be described later is preferably 30° to 60°, more preferably 40° to 50°, still more preferably 42° to 48°, and particularly preferably 45° in the polarizing plate of the embodiment of the present invention.

Here, the "slow axis" of the λ/4 plate means a direction in which the refractive index in the plane of the λ/4 plate is maximum, and the "absorption axis" of the polarizer means a direction in which the absorbance is highest.

[Polarizer]

A polarizer contained in a polarizing plate of an embodiment of the present invention is not particularly limited as long as it is a member having a function of converting light into specific linearly polarized light, and an absorptive type polarizer and a reflective type polarizer, which are known in the related art, can be used.

An iodine-based polarizer, a dye-based polarizer using a dichroic dye, a polyene-based polarizer, or the like is used as the absorptive type polarizer. The iodine-based polarizer and the dye-based polarizer are classified into a coating type polarizer and a stretching type polarizer, any of which can be applied, but a polarizer which is manufactured by allowing polyvinyl alcohol to adsorb iodine or a dichroic dye and performing stretching is preferable.

In addition, examples of a method of obtaining a polarizer by carrying out stretching and dyeing in a state of a laminated film in which a polyvinyl alcohol layer is formed on a base material include the methods disclosed in JP5048120B, JP5143918B, JP4691205B, JP4751481B, and JP4751486B, and known technologies relating to these polarizers can also be preferably used.

A polarizer in which thin films having different birefringence are laminated, a wire grid-type polarizer, a polarizer having a combination of a cholesteric liquid crystal having a selective reflection range, and a ¼ wavelength plate, or the like is used as the reflective type polarizer.

Among those, a polymer containing a polyvinyl alcohol-based resin (—$CH_2$—CHOH— as a repeating unit) from the viewpoint that it has more excellent adhesiveness. In particular, a polarizer containing at least one selected from the group consisting of polyvinyl alcohol and an ethylene-vinyl alcohol copolymer) is preferable.

In the present invention, the thickness of the polarizer is not particularly limited, but is preferably 3 μm to 60 μm, more preferably 5 μm to 30 μm, and still more preferably 5 μm to 15 μm.

[Pressure-Sensitive Adhesive Layer]

The polarizing plate of the embodiment of the present invention may have a pressure-sensitive adhesive layer arranged between the optically anisotropic film in the optical film of the embodiment of the present invention and the polarizer.

The pressure-sensitive adhesive layer used for lamination of the optically anisotropic film and the polarizer represents, for example, a substance in which a ratio (tan δ=G"/G') between a storage elastic modulus G' and a loss elastic modulus G", each measured with a dynamic viscoelastometer, is 0.001 to 1.5, and examples thereof include a so-called pressure-sensitive adhesive or a readily creepable substance. Examples of the pressure-sensitive adhesive that can be used in the present invention include a polyvinyl alcohol-based pressure-sensitive adhesive, but the pressure-sensitive adhesive is not limited thereto.

[Image Display Device]

An image display device of an embodiment of the present invention is an image display device having the optical film of the embodiment of the present invention or the polarizing plate of the embodiment of the present invention.

A display element used in the image display device of the embodiment of the present invention is not particularly limited, and examples thereof include a liquid crystal cell, an organic electroluminescent (hereinafter simply referred to as "EL") display panel, and a plasma display panel.

Among those, the liquid crystal cell and the organic EL display panel are preferable, and the liquid crystal cell is more preferable. That is, as the image display device of the embodiment of the present invention, a liquid crystal display device using a liquid crystal cell as a display element or an organic EL display device using an organic EL display panel as a display element is preferable, and the liquid crystal display device is more preferable.

[Liquid Crystal Display Device]

A liquid crystal display device which is an example of the image display device of the embodiment of the present invention is a liquid crystal display device having the above-mentioned polarizing plate of the embodiment of the present invention and a liquid crystal cell.

In addition, in the present invention, it is preferable that the polarizing plate of the embodiment of the present invention is used as the polarizing plate of the front side, and it is more preferable that the polarizing plate of the embodiment of the present invention is used as the polarizing plates on the front and rear sides, among the polarizing plates provided on the both sides of the liquid crystal cell.

Hereinafter, the liquid crystal cell constituting the liquid crystal display device will be described in detail.

<Liquid Crystal Cell>

A liquid crystal cell for use in the liquid crystal display device is preferably in a vertical alignment (VA) mode, an optically compensated bend (OCB) mode, an in-plane-switching (IPS) mode, or a twisted nematic (TN) mode, but the liquid crystal cell is not limited thereto.

In a TN-mode liquid crystal cell, rod-shaped liquid crystal molecules are substantially horizontally aligned and are twist-aligned at 60° to 120° during no voltage application thereto. A TN-mode liquid crystal cell is most often used in a color TFT liquid crystal display device and described in numerous documents.

In a VA-mode liquid crystal cell, rod-shaped liquid crystal molecules are substantially vertically aligned during no voltage application thereto. Examples of the VA-mode liquid crystal cell include (1) a VA-mode liquid crystal cell in the narrow sense of the word, in which rod-shaped liquid crystal molecules are substantially vertically aligned during no voltage application thereto, but are substantially horizontally aligned during voltage application thereto (described in JP1990-176625A (JP-H02-176625A)), (2) an MVA-mode liquid crystal cell in which the VA-mode is multi-domained for viewing angle enlargement (described in SID97, Digest of Tech. Papers (preprint), 28 (1997) 845), (3) a liquid crystal cell in a mode (n-ASM mode) in which rod-shaped liquid crystal molecules are substantially vertically aligned during no voltage application thereto and are multi-domain-aligned during voltage application thereto (described in Seminar of Liquid Crystals of Japan, Papers (preprint), 58-59 (1998)), and (4) a survival-mode liquid crystal cell (announced in LCD International 98), In addition, the liquid crystal cell may be of any of a patterned vertical alignment (PVA) type, an optical alignment type, and polymer-sustained alignment (PSA) type. Details of these modes are specifically described in JP2006-215326A and JP2008-538819A.

In an IPS-mode liquid crystal cell, rod-shaped liquid crystal molecules are aligned substantially parallel with respect to a substrate, and application of an electric field parallel to the substrate surface causes the liquid crystal molecules to respond planarly. The IPS-mode displays black in a state where no electric field is applied and a pair of upper and lower polarizing plates have absorption axes which are orthogonal to each other. A method of improving the viewing angle by reducing light leakage during black display in an oblique direction using an optical compensation sheet is disclosed in JP1998-054982A (JP-H10-054982A), JP1999-202323A (JP-H11-202323A), JP1997-292522A (JP-H09-292522A), JP1999-133408A (JP-H11-133408A), JP1999-305217A (JP-H11-305217A), JP1998-307291A (JP-H10-307291A), and the like.

[Organic EL Display Device]

Suitable examples of the organic EL display device which is an example of the image display device of the embodiment of the present invention include an aspect which includes, from the visible side, a polarizer, a λ/4 plate (a positive A-plate) including the optically anisotropic film of the embodiment of the present invention, and an organic EL display panel in this order.

Furthermore, the organic EL display panel is a display panel composed of an organic EL device in which an organic light emitting layer (organic electroluminescent layer) is sandwiched between electrodes (between a cathode and an anode). The configuration of the organic EL display panel is not particularly limited but a known configuration is adopted.

EXAMPLES

Hereinafter, the present invention will be described in more detail with reference to Examples. The materials, the amounts of materials used, the proportions, the treatment details, the treatment procedure, and the like shown in Examples below can be appropriately modified as long as the modifications do not depart from the spirit of the present invention. Therefore, the scope of the present invention should not be construed as being limited to Examples shown below.

[Synthesis of Compound X-1]

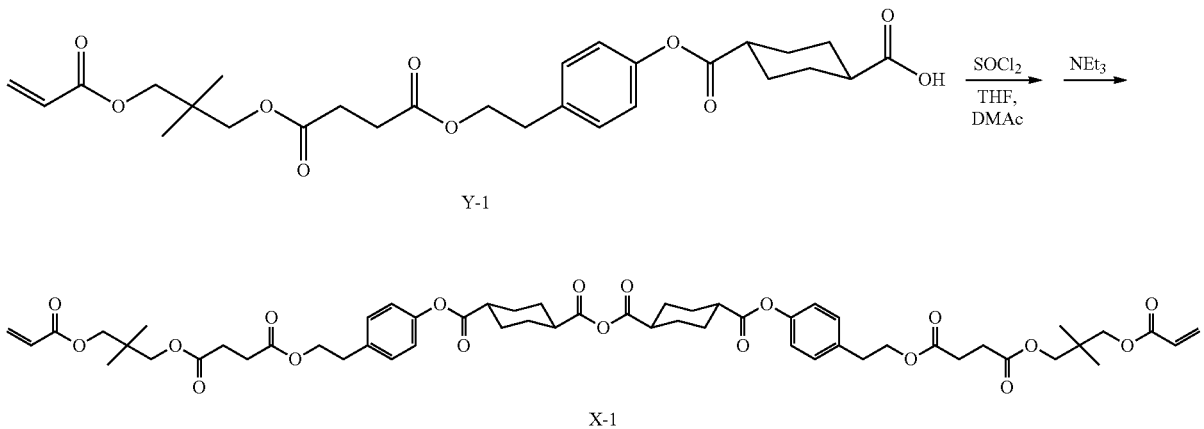

First, a compound Y-1 in the scheme was synthesized by the method described in paragraphs [0123] to [0125] of JP2016-081035A.

Next, as shown in the scheme, the compound Y-1 (30 mmol), 60 mL of tetrahydrofuran (THF), 20 mL of N,N-dimethylacetamide (DMAc), and 2,6-di-t-butyl-4-methylphenol (BUT) (1.5 mmol) were mixed at room temperature (23° C.), and the internal temperature was lowered to 5° C.

To the mixture was added dropwise thionyl chloride ($SOCl_2$) (15 mmol) so that the internal temperature was not elevated to 10° C. or higher. After stirring at 5° C. for 1 hour, triethylamine ($NEt_3$) (20 mmol) was added dropwise thereto and the mixture was stirred at room temperature for 2 hours.

After stirring, 60 ml of water and 60 ml of ethyl acetate were added thereto to perform liquid separation.

The organic layer was washed with water and a 2% aqueous sodium hydrogen carbonate solution in this order, and dried over magnesium sulfate, and the solvent was evaporated under reduced pressure. The obtained crude product was purified by silica gel column chromatography to obtain the compound X-1 in a yield of 60%.

[Synthesis of Compound X-2]

As shown in the scheme below, a compound X-2 was synthesized in the same manner as for the compound X-1, except that the compound Y-1 in the synthesis of compound X-1 was changed to the compound Y-2.

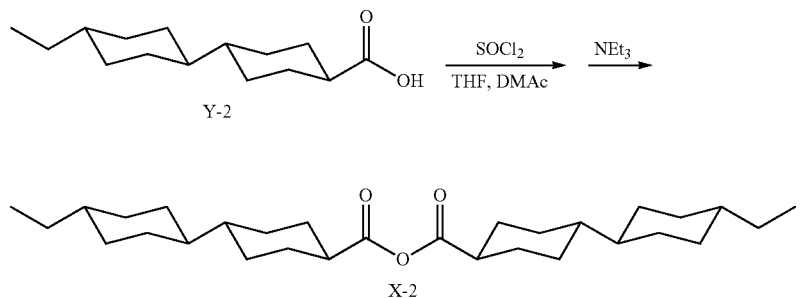

[Synthesis of Compound X-3]

A compound Y-3 in the following scheme was synthesized by the method described in paragraphs [0091] and [0092] of JP2018-025770A.

Then, as shown in the scheme below, a compound X-3 was synthesized in the same manner as for the compound X-1, except that the compound Y-1 in the synthesis of compound X-1 was changed to the compound Y-3.

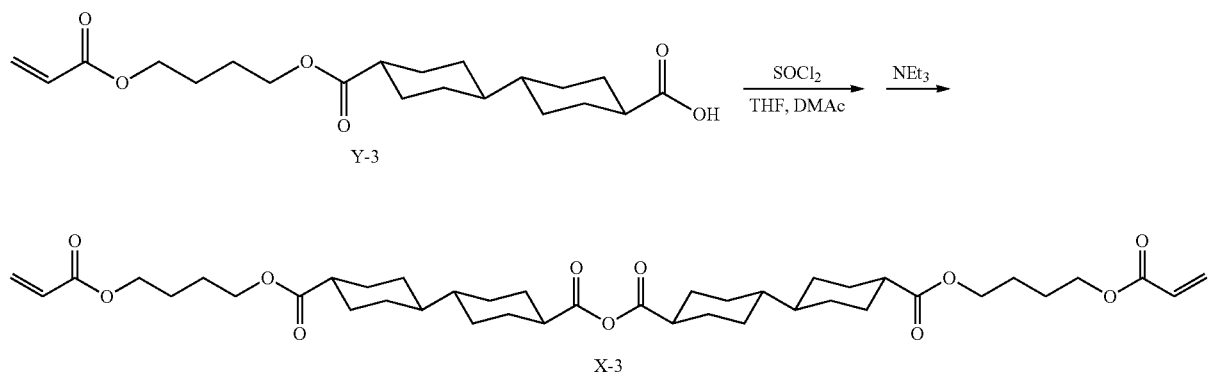

[Synthesis of Compound X-4]

A compound Y-4 in the following scheme was synthesized by the method described in paragraph [0392] of JP2010-031223A.

Then, as shown in the scheme below, a compound X-4 was synthesized in the same manner as for the compound X-1, except that the compound Y-1 in the synthesis of compound X-1 was changed to the compound Y-4.

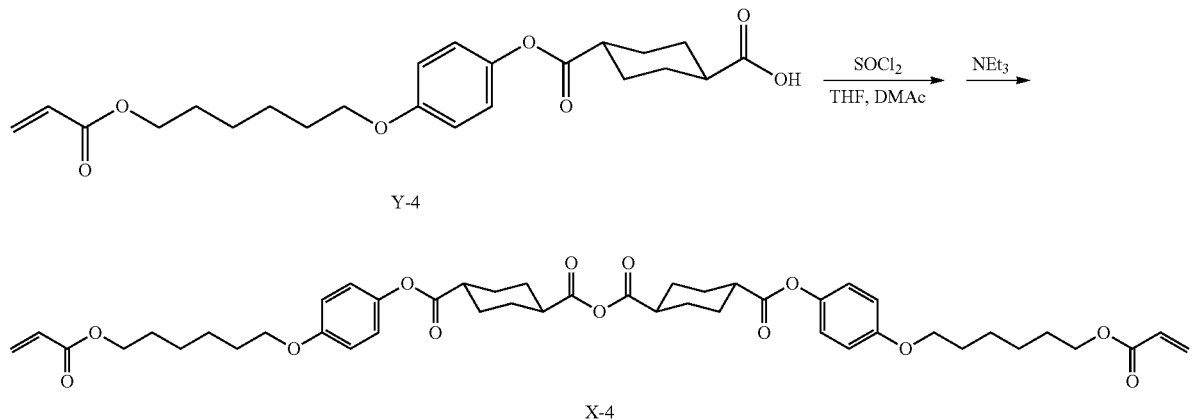

[Synthesis of Compound X-5]

A compound Y-5 in the following scheme was synthesized by the method described in JP2016-053149A.

Then, as shown in the scheme below, a compound X-5 was synthesized in the same manner as for the compound X-1, except that the compound Y-1 in the synthesis of compound X-1 was changed to the compound Y-5.

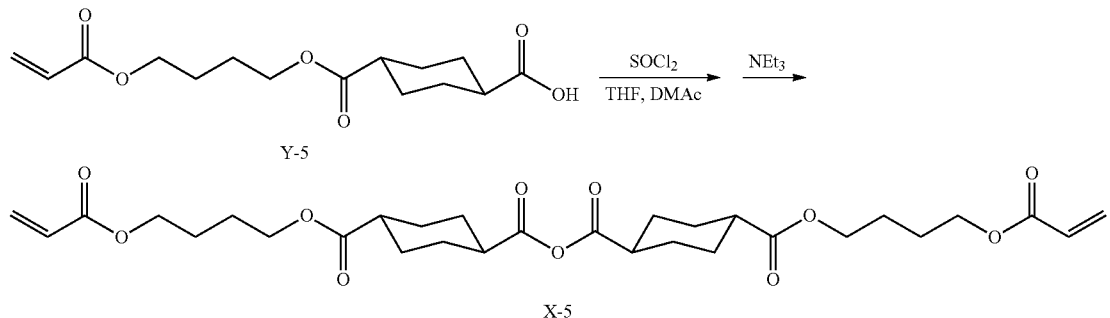

[Polymerizable Liquid Crystal Compound]

The polymerizable liquid crystal compounds L-1 to L-7 shown below were used as the polymerizable liquid crystal compounds.

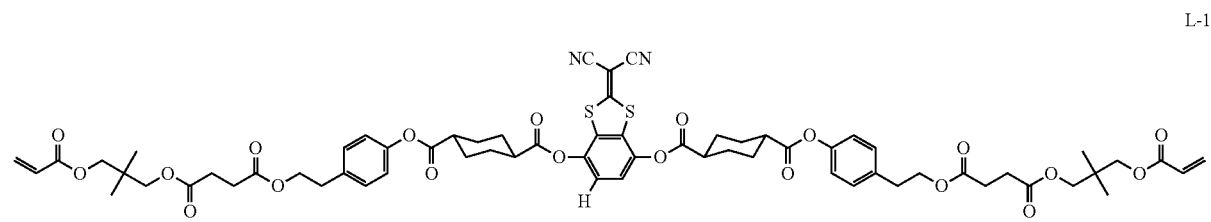

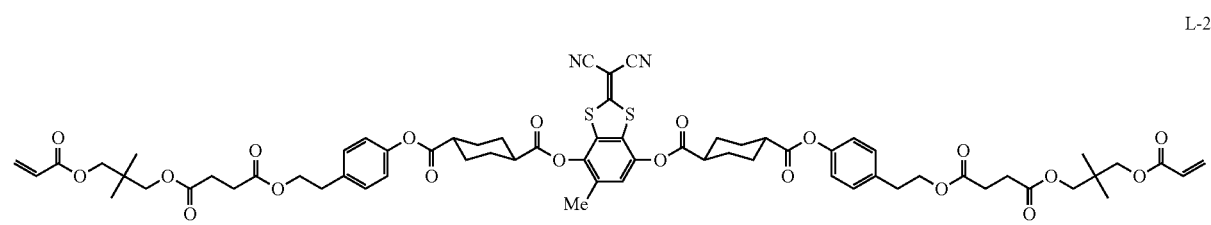

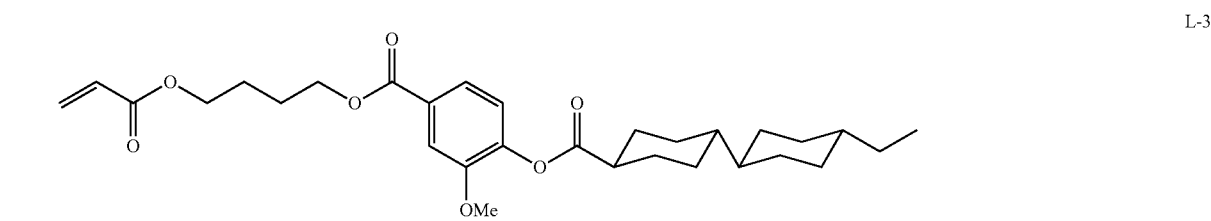

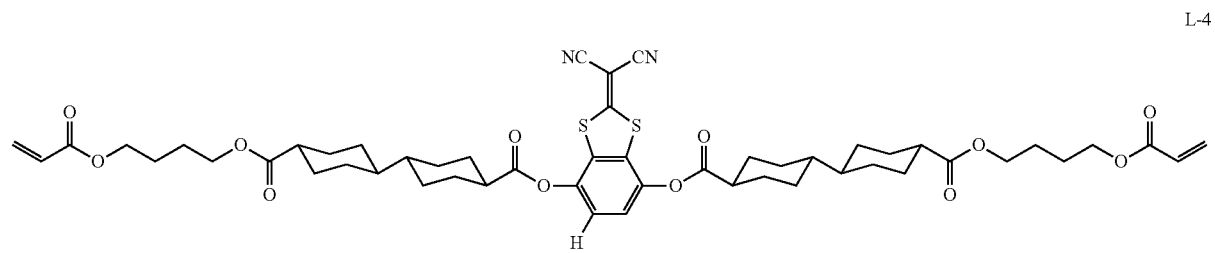

-continued

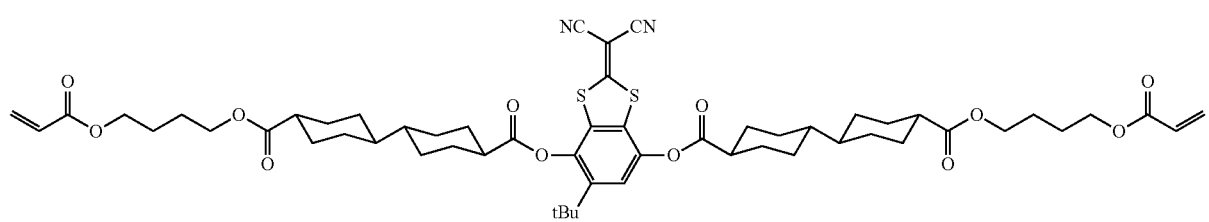

L-5

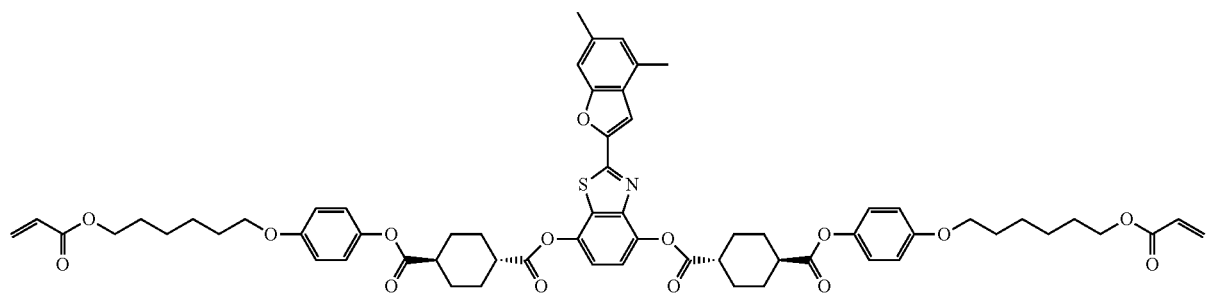

L-6

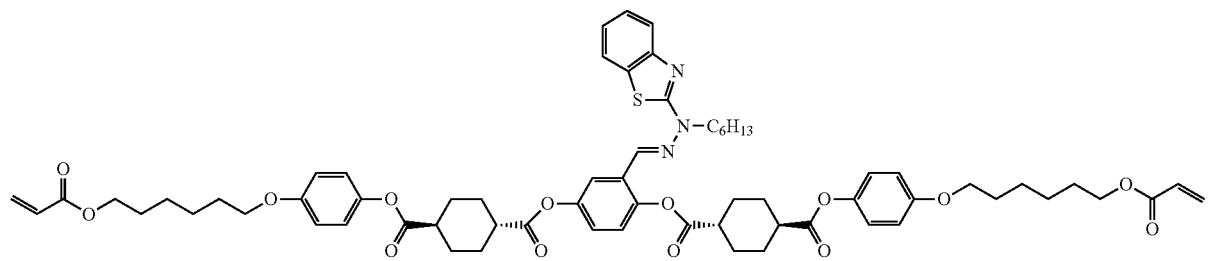

L-7

Examples 1 to 10 and Comparative Examples 1 and 2

A polymerizable composition (a coating liquid for an optically anisotropic film) having the following composition was prepared and applied onto a glass substrate including a rubbing-treated polyimide alignment film (SE-150 manufactured by Nissan Chemical Industries, Ltd.) by spin coating. The coating film was subjected to an alignment treatment at 140° C. to form a liquid crystal layer. Thereafter, the liquid crystal layer was cooled to 60° C. and subjected to alignment fixation by irradiation with ultraviolet rays at 1,000 mJ/cm$^2$ to form an optically anisotropic film, thereby obtaining an optical film for measuring a wavelength dispersion.

<Surface Condition>

With regard to the manufactured optical film, the surface condition was confirmed with a polarizing microscope and visual observation, and evaluated according to the following standard. The results are shown in Table 3 below.

A: No bright spots or streak-like defects are observed.
B: Some bright spots and streak-like defects are observed.
C: There are many bright spots or streak-like defects.
D: Not aligned.

<Moisture-Heat Resistance>

With regard to test conditions for the moisture-heat resistance, a test in which art object was left to stand in an environment of 100° C. and a relative humidity of 95% for 144 hours was carried out. The Re(550) of the optical him

| Coating liquid for optically anisotropic film | |
|---|---|
| Polymerizable liquid crystal compound in Table 3 below | 15 parts by mass (total amount) |
| Compound (1) in Table 3 below | parts by mass in Table 1 below |
| Photopolymerization initiator (IRGACURE 819, manufactured by BASF) | 0.45 parts by mass |
| Fluorine-containing compound A below | 0.12 parts by mass |
| Cyclopentanone | 85.00 parts by mass |

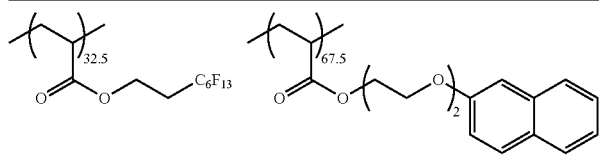

Fluorine-containing compound A after the test was measured, and the moisture-heat resistance was evaluated according to the following standard. The results are shown in Table 3 below.

AA: A variation in Re(550) after the test with respect to the initial phase difference value is less than 5%.

A: A variation in Re(550) after the test with respect to initial phase difference value is 5% or more and less than 10%.

B: A variation in Re(550) after the test with respect to the initial phase difference value is 10% or more and less than 20%.

C: A variation in Re(550) after the test with respect to initial phase difference value is 20% or more.

TABLE 3

| | Polymerizable liquid crystal compound (upper column: type) (lower column: % by mass with respect to 15 parts by mass) | | | Compound 1 (upper column: type) (lower column: parts by mass) | Surface condition | Moisture-heat resistance |
|---|---|---|---|---|---|---|
| Example 1 | L-1 40 | L-2 40 | L-3 20 | X-1 0.1 | A | A |
| Example 2 | L-1 40 | L-2 40 | L-3 20 | X-2 0.1 | A | A |
| Example 3 | L-4 40 | L-5 40 | L-3 20 | X-3 0.01 | B | AA |
| Example 4 | L-4 40 | L-5 40 | L-3 20 | X-3 0.1 | A | A |
| Example 5 | L-4 40 | L-5 40 | L-3 20 | X-3 0.5 | A | A |
| Example 6 | L-4 40 | L-5 40 | L-3 20 | X-3 5 | A | B |
| Example 7 | L-4 100 | | | X-3 0.5 | A | A |
| Example 8 | L-4 40 | L-5 40 | L-3 20 | X-5 0.1 | A | A |
| Example 9 | L-6 100 | | | X-4 0.5 | A | A |
| Example 10 | L-7 100 | | | X-4 0.5 | A | A |
| Comparative Example 1 | L-4 40 | L-5 40 | L-3 20 | X-3 7 | A | C |
| Comparative Example 2 | L-4 100 | | | | C | AA |

From the results shown in Table 3 above, it was found that in a case where the blending amount of the compound (I) was large, the moisture-heat resistance of an optically anisotropic film formed was deteriorated (Comparative Example 1), Moreover, it was found that in a case where the compound (I) was not compounded, the surface condition of an optically anisotropic film formed was deteriorated (Comparative Example 2).

In contrast, it was found that in a case where the compound (I) was compounded in a predetermined amount, the surface condition of an optically anisotropic film formed was good and the moisture-heat resistance was also good (Examples 1 to 10).

EXPLANATION OF REFERENCES

10: optical film
12: optically anisotropic film
14: alignment film
16: support
18: hard coat layer

What is claimed is:

1. A polymerizable liquid crystal composition comprising: a polymerizable liquid crystal compound; and a compound represented by Formula (I), wherein a content of the compound represented by Formula (I) is 0.01 to 3 parts by mass with respect to 100 parts by mass of the polymerizable liquid crystal compound, $L^1-SP^1-(E^3-A^1)_m-E^1-G^1-C(=O)-O-C(=O)-G^2-E^2-(A^2-E^4)_n-SP^2-L^2$ (I)

here, in Formula (I), m and n each independently represent an integer of 0 to 2, $E^1$, $E^2$, $E^3$, and $E^4$ each independently represent a single bond, or a divalent linking group consisting of —CO—, —O—, —S—, —C(=S)—, —$CR^1R^2$—, —$CR^3=CR^4$—, —$NR^5$—, or a combination of two or more thereof, where $R^1$ to $R^5$ each independently represent a hydrogen atom, a fluorine atom, or an alkyl group having 1 to 4 carbon atoms, in a case where m is an integer of 2 or more, a plurality of $E^3$'s may be the same as or different from each other, and in a case where n is an integer of 2 or more, a plurality of $E^4$'s may be the same as or different from each other, $G^1$ and $G^2$ are each independently a cycloalkane ring having 6 carbon atoms, which may have a substituent, $A^1$ and $A^2$ each independently represent an aromatic ring having 6 carbon atoms, which may have a substituent, or a cycloalkane ring having 6 carbon atoms, which may have a substituent, in a case where m is an integer of 2 or more, a plurality of $A^1$'s may be the same as or different from each other, and in a case where n is an integer of 2 or more, a plurality of $A^2$'s may be the same as or different from each other, SP¹ and SP² each independently represent a single bond, a linear or branched alkylene group having 1 to 20 carbon atoms, a linear or branched alkenylene group having 2 to 20 carbon atoms, a linear or branched alkynylene group having 2 to 20 carbon atoms, or a divalent linking group in which one or more of —CH$_2$—'s constituting the alkylene group, the alkenylene group, and the alkynylene group are substituted with —O—, —S—, —NH—, —N(Q)—, or —CO—, where Q represents a substituent, and $L^1$ and $L^2$ each independently represent an alkyl group which may have a substituent, an aryl group which may have a substituent, a heteroaryl group which may have a substituent, or a polymerizable group.

2. The polymerizable liquid crystal composition according to claim 1, wherein the polymerizable liquid crystal compound is a compound represented by Formula (II), $L^1$-$SP^1$-($E^3$-$A^1$)$_m$-$E^1$-$G^1$-C(=O)—O—Ar-O-C(=O) -$G^2$-$E^2$-($A^2$-$E^4$)$_n$-$SP^2$-$L^2$ (II)

here, in Formula (II), m and n each independently represent an integer of 0 to 2, $E^1$, $E^2$, $E^3$, and $E^4$ each independently represent a single bond, or a divalent linking group consisting of —CO—, —O—, —S—, —C(=S)—, —$CR^1R^2$—, —$CR^3$=$CR^4$—, —$NR^5$—, or a combination of two or more thereof, where $R^1$ to $R^5$ each independently represent a hydrogen atom, a fluorine atom, or an alkyl group having 1 to 4 carbon atoms, in a case where m is an integer of 2 or more, a plurality of $E^3$'s may be the same as or different from each other, and in a case where n is an integer of 2 or more, a plurality of $E^4$'s may be the same as or different from each other, $G^1$, $G^2$, $A^1$, and $A^2$ each independently represent an aromatic ring having 6 carbon atoms, which may have a substituent, or a cycloalkane ring having 6 carbon atoms, which may have a substituent, in a case where m is an integer of 2 or more, a plurality of $A^1$'s may be the same as or different from each other, and in a case where n is an integer of 2 or more, a plurality of $A^2$'s may be the same as or different from each other, SP¹ and SP² each independently represent a single bond, a linear or branched alkylene group having 1 to 20 carbon atoms, a linear or branched alkenylene group having 2 to 20 carbon atoms, a linear or branched alkynylene group having 2 to 20 carbon atoms, or a divalent linking group in which one or more of —CH$_2$-'s constituting the alkylene group, the alkenylene group, and the alkynylene group are substituted with —O—, —S—, —NH—, —N(Q)—, or —CO—, where Q represents a substituent, $L^1$ and $L^2$ each independently represent an alkyl group which may have a substituent, an aryl group which may have a substituent, a heteroaryl group which may have a substituent, or a polymerizable group, and at least one of $L^1$ or $L^2$ represents a polymerizable group, provided that in a case where Ar in Formula (II) is an aromatic ring represented by Formula (Ar-3), at least one of $L^1$ or $L^2$, or $L^3$ or $L^4$ in Formula (Ar-3) represents a polymerizable group, and Ar represents any aromatic ring selected from the group consisting of groups represented by Formulae (Ar-1) to (Ar-5),

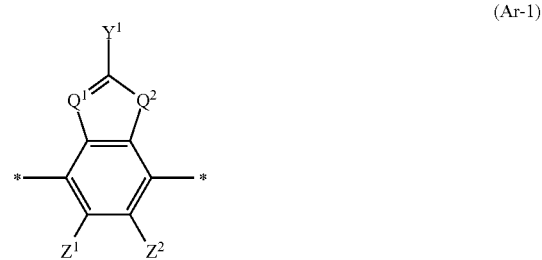

(Ar-1)

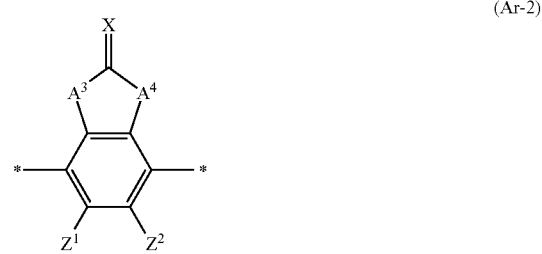

(Ar-2)

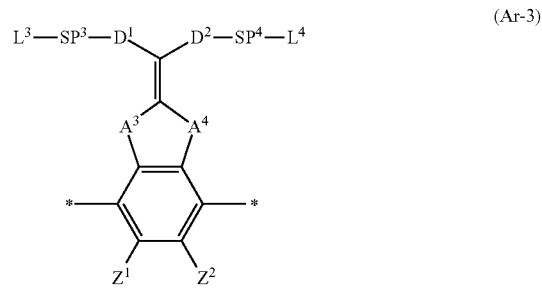

(Ar-3)

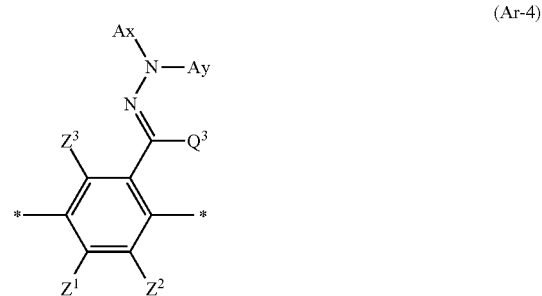

(Ar-4)

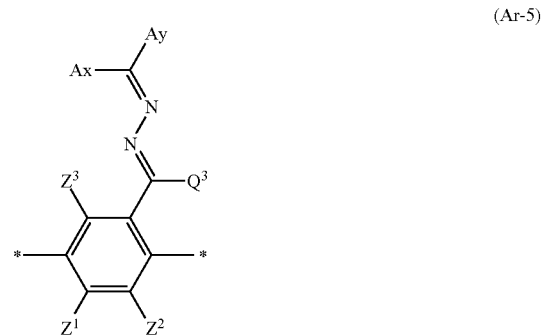

(Ar-5)

here, in Formulae (Ar-1) to (Ar-5),

* represents a bonding position to an oxygen atom, $Q^1$ represents N or CH, $Q^2$ represents —S—, —O—, or —N($R^6$)—, where $R^6$ represents a hydrogen atom or an alkyl group having 1 to 6 carbon atoms, $Y^1$ represents an aromatic hydrocarbon group having 6 to 12 carbon atoms or an aromatic heterocyclic group having 3 to 12 carbon atoms, which may have a substituent, $Z^1$, $Z^2$, and $Z^3$ each independently represent a hydrogen atom, a monovalent aliphatic hydrocarbon group having 1 to 20 carbon atoms, a monovalent alicyclic hydrocarbon group having 3 to 20 carbon atoms, a monovalent aromatic hydrocarbon group having 6 to 20 carbon atoms, a halogen atom, a cyano group, a nitro group, -$OR^7$, -$NR^8R^9$, or -$SR^{10}$, where $R^7$ to $R^{10}$ each independently represent a hydrogen atom or an alkyl group having 1 to 6 carbon atoms, and $Z^1$ and $Z^2$ may be bonded to each other to form an aromatic ring, $A^3$ and $A^4$ each independently represent a group selected from the group consisting of —O—, —N($R^{11}$)—, —S—, and —CO—, where $R^{11}$ represents a hydrogen atom or a substituent, X represents a non-metal atom of Groups XIV to XVI, to which a hydrogen atom or a substituent may be bonded, $D^1$ and $D^2$ each independently represent a single bond, or a divalent linking group consisting of —CO—, —O—, —S—, —C(=S)—, —$CR^1R^2$—, —$CR^3$=$CR^4$—, —$NR^5$—, or a combination of two or more thereof, where $R^1$ to $R^5$ each independently represent a hydrogen atom, a fluorine atom, or an alkyl group having 1 to 4 carbon atoms, $SP^3$ and $SP^4$ each independently represent a single bond, a linear or branched alkylene group having 1 to 20 carbon atoms, a linear or branched alkenylene group having 2 to 20 carbon atoms, a linear or branched alkynylene group having 2 to 20 carbon atoms, or a divalent linking group in which one or more of —$CH_2$—'s constituting the alkylene group, the alkenylene group, and the alkynylene group are substituted with —O—, —S—, —NH—, —N(Q)—, or —CO—, where Q represents a substituent, $L^3$ and $L^4$ each independently represent an alkyl group which may have a substituent, an aryl group which may have a substituent, a heteroaryl group which may have a substituent, or a polymerizable group, and at least one of $L^3$ or $L^4$, or $L^1$ or $L^2$ represents a polymerizable group, Ax represents an organic group having 2 to 30 carbon atoms, which has at least one aromatic ring selected from the group consisting of an aromatic hydrocarbon ring and an aromatic heterocyclic ring, Ay represents a hydrogen atom, an alkyl group having 1 to 12 carbon atoms, which may have a substituent, or an organic group having 2 to 30 carbon atoms, which has at least one aromatic ring selected from the group consisting of an aromatic hydrocarbon ring and an aromatic heterocyclic ring, the aromatic ring in each of Ax and Ay may have a substituent, and Ax and Ay may be bonded to each other to form a ring, and $Q^3$ represents a hydrogen atom or an alkyl group having 1 to 6 carbon atoms, which may have a substituent.

3. An optically anisotropic film obtained by polymerizing the polymerizable liquid crystal composition according to claim 1.

4. An optical film comprising the optically anisotropic film according to claim 3.

5. A polarizing plate comprising:
the optical film according to claim 4; and
a polarizer.

6. An image display device comprising the optical film according to claim 4.

7. An image display device comprising the polarizing plate according to claim 5.

8. A polymerizable liquid crystal composition comprising:
a polymerizable liquid crystal compound; and
a compound represented by Formula (I),
wherein a content of the compound represented by Formula (I) is 0.01 to 3 parts by mass with respect to 100 parts by mass of the polymerizable liquid crystal compound, $L^1$-$SP^1$-($E^3$-$A^1$)$_m$-$E^1$-$G^1$-C(=O)—O—C(=O)-$G^2$-$E^2$-($A^2$-$E^4$)$_n$-$SP^2$-$L^2$ (I)

here, in Formula (I), m and n each independently represent an integer of 0 to 2, $E^1$, $E^2$, $E^3$, and $E^4$ each independently represent a single bond, or a divalent linking group consisting of —CO—, —O—, —S—, —C(=S)—, —$CR^1R^2$—, —$CR^3$=$CR^4$—, —$NR^5$—, or a combination of two or more thereof, where $R^1$ to $R^5$ each independently represent a hydrogen atom, a fluorine atom, or an alkyl group having 1 to 4 carbon atoms, in a case where m is an integer of 2 or more, a plurality of $E^3$'s may be the same as or different from each other, and in a case where n is an integer of 2 or more, a plurality of $E^4$'s may be the same as or different from each other, $G^1$, $G^2$, $A^1$, and $A^2$ each independently represent an aromatic ring having 6 carbon atoms, which may have a substituent, or a cycloalkane ring having 6 carbon atoms, which may have a substituent, in a case where m is an integer of 2 or more, a plurality of $A^1$'s may be the same as or different from each other, and in a case where n is an integer of 2 or more, a plurality of $A^2$'s may be the same as or different from each other, $SP^1$ and $SP^2$ each independently represent a single bond, a linear or branched alkylene group having 1 to 20 carbon atoms, a linear or branched alkenylene group having 2 to 20 carbon atoms, a linear or branched alkynylene group having 2 to 20 carbon atoms, or a divalent linking group in which one or more of —$CH_2$—'s constituting the alkylene group, the alkenylene group, and the alkynylene group are substituted with —O—, —S—, —NH—, —N(Q)—, or —CO—, where Q represents a substituent, $L^1$ and $L^2$ each independently represent an alkyl group which may have a substituent, an aryl group which may have a substituent, a heteroaryl group which may have a substituent, or a polymerizable group, and wherein the polymerizable liquid crystal compound is a compound represented by Formula (II), $L^1$-$SP^1$-($E^3$-$A^1$)$_m$-$E^1$-$G^1$-C(=O)—O—Ar-O-C(=O)-$G^2$-$E^2$-($A^2$-$E^4$)$_n$-$SP^2$-$L^2$ (II)

here, in Formula (II), m and n each independently represent an integer of 0 to 2, $E^1$, $E^2$, $E^3$, and $E^4$ each independently represent a single bond, or a divalent linking group consisting of —CO—, —O—, —S—, —C(=S)—, —$CR^1R^2$—, —$CR^3$=$CR^4$—, —$NR^5$—, or a combination of two or more thereof, where $R^1$ to $R^5$ each independently represent a hydrogen atom, a fluorine atom, or an alkyl group having 1 to 4 carbon atoms, in a case where m is an integer of 2 or more, a plurality of $E^3$'s may be the same as or different from each other, and in a case where n is an integer of 2 or more, a plurality of $E^4$'s may be the same as or different from each other, $G^1$, $G^2$, $A^1$, and $A^2$ each independently represent an aromatic ring having 6 carbon atoms, which may have a substituent, or a cycloalkane ring having 6 carbon atoms, which may have a substituent, in a case where m is an integer of 2 or more, a plurality of $A^1$'s may be the same as or different from each other, and in a case where n is an integer of 2 or more, a plurality of $A^2$'s may be the same as or different from each other, $SP^1$ and $SP^2$ each independently represent a single bond, a linear or branched alkylene group having 1 to 20 carbon atoms, a linear or branched alkenylene group having 2 to 20 carbon atoms, a linear or branched alkynylene group having 2 to 20 carbon atoms, or a divalent linking group in which one or more of —$CH_2$—'s constituting the alkylene group, the alkenylene group, and the alkynylene group are substituted with —O—, —S—, —NH—, —N(Q)—, or —CO—, where Q represents a substituent, $L^1$ and $L^2$ each independently represent an alkyl group which may have a substituent, an aryl group which may have a substituent, a heteroaryl group which may have a substituent, or a polymerizable group, and at least one of $L^1$ or $L^2$ represents a polymerizable group, provided that in a case where Ar in Formula (II) is an aromatic ring represented by Formula (Ar-3), at least one of $L^1$ or $L^2$, or $L^3$ or $L^4$ in Formula (Ar-3) represents a polymerizable group, and Ar represents any aromatic ring selected from the group consisting of groups represented by Formulae (Ar-1) to (Ar-5),

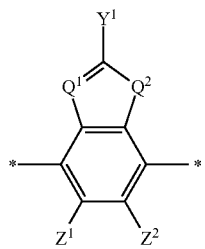

(Ar-1)

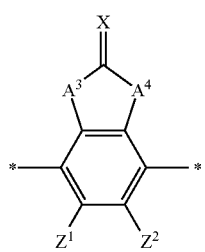

(Ar-2)

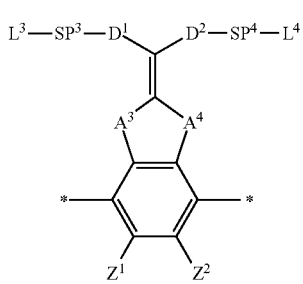

(Ar-3)

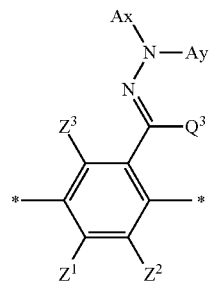

(Ar-4)

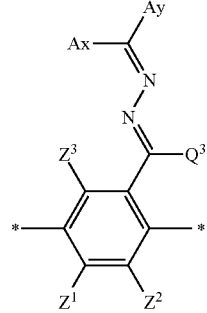

(Ar-5)

here, in Formulae (Ar-1) to (Ar-5),

* represents a bonding position to an oxygen atom, $Q^1$ represents N or CH, $Q^2$ represents —S—, —O—, or —N($R^6$)—, where $R^6$ represents a hydrogen atom or an alkyl group having 1 to 6 carbon atoms, $Y^1$ represents an aromatic hydrocarbon group having 6 to 12 carbon atoms or an aromatic heterocyclic group having 3 to 12 carbon atoms, which may have a substituent, $Z^1$, $Z^2$, and $Z^3$ each independently represent a hydrogen atom, a monovalent aliphatic hydrocarbon group having 1 to 20 carbon atoms, a monovalent alicyclic hydrocarbon group having 3 to 20 carbon atoms, a monovalent aromatic hydrocarbon group having 6 to 20 carbon atoms, a halogen atom, a cyano group, a nitro group, -$OR^7$, -$NR^8R^9$, or -$SR^{10}$, where $R^7$ to $R^{10}$ each independently represent a hydrogen atom or an alkyl group having 1 to 6 carbon atoms, and $Z^1$ and $Z^2$ may be bonded to each other to form an aromatic ring, $A^3$ and $A^4$ each independently represent a group selected from the group consisting of —O—, —N($R^{11}$)—, —S—, and —CO—, where $R^{11}$ represents a hydrogen atom or a substituent, X represents a non-metal atom of Groups XIV to XVI, to which a hydrogen atom or a substituent may be bonded, $D^1$ and $D^2$ each independently represent a single bond, or a divalent linking group consisting of —CO—, —O—, —S—, —C(=S)—, —$CR^1R^2$—, —$CR^3$=$CR^4$—, —$NR^5$—, or a combination of two or more thereof, where $R^1$ to $R^5$ each independently represent a hydrogen atom, a fluorine atom, or an alkyl group having 1 to 4 carbon atoms, $SP^3$ and $SP^4$ each independently represent a single bond, a linear or branched alkylene group having 1 to 20 carbon atoms, a linear or branched alkenylene group having 2 to 20 carbon atoms, a linear or branched alkynylene group having 2 to 20 carbon atoms, or a divalent linking group in which one or more of —$CH_2$—'s constituting the alkylene group, the alkenylene group, and the alkynylene group are substituted with —O—, —S—, —NH—, —N(Q)—, or —CO—, where Q represents a substituent, $L^3$ and $L^4$ each independently represent an alkyl group which may have a substituent, an aryl group which may have a substituent, a heteroaryl group which may have a substituent, or a polymerizable group, and at least one of $L^3$ or $L^4$, or $L^1$ or $L^2$ represents a polymerizable group, Ax represents an organic group having 2 to 30 carbon atoms, which has at least one aromatic ring selected from the group consisting of an aromatic hydrocarbon ring and an aromatic heterocyclic ring, Ay represents a hydrogen atom, an alkyl group having 1 to 12 carbon atoms, which may have a substituent, or an organic group having 2 to 30 carbon atoms, which has at least one aromatic ring selected from the group consisting of an aromatic hydrocarbon ring and an aromatic heterocyclic ring, the aromatic ring in each of Ax and Ay may have a substituent, and Ax and Ay may be bonded to each other to form a ring, and $Q^3$ represents a hydrogen atom or an alkyl group having 1 to 6 carbon atoms, which may have a substituent.

9. An optically anisotropic film obtained by polymerizing the polymerizable liquid crystal composition according to claim 8.

10. An optical film comprising the optically anisotropic film according to claim 9.

11. A polarizing plate comprising:
the optical film according to claim 10; and
a polarizer.

12. An image display device comprising the optical film according to claim 10.

13. An image display device comprising the polarizing plate according to claim 11.

* * * * *